(12) United States Patent
Wright

(10) Patent No.: US 7,385,445 B2
(45) Date of Patent: Jun. 10, 2008

(54) HIGH EFFICIENCY AMPLIFIER CIRCUITS HAVING BYPASS PATHS

(75) Inventor: Peter Wright, Hillsboro, OR (US)

(73) Assignee: TriQuint Semiconductor, Inc., Hillsboro, OR (US)

(*) Notice: Subject to any disclaimer, the term of this patent is extended or adjusted under 35 U.S.C. 154(b) by 59 days.

(21) Appl. No.: 11/187,258

(22) Filed: Jul. 21, 2005

(65) Prior Publication Data

US 2007/0018720 A1 Jan. 25, 2007

(51) Int. Cl.
*H03F 1/14* (2006.01)
(52) U.S. Cl. .................................. 330/51; 330/124 D
(58) Field of Classification Search ............ 330/124 D, 330/151, 302, 51, 284
See application file for complete search history.

(56) References Cited

U.S. PATENT DOCUMENTS

| | | | |
|---|---|---|---|
| 5,008,631 | A | 4/1991 | Scherer et al. |
| 5,017,888 | A | 5/1991 | Meinzer |
| 5,025,225 | A | 6/1991 | Tajima et al. |
| 5,152,004 | A | 9/1992 | Väisänen et al. |
| 5,175,871 | A | 12/1992 | Kunkel |
| 5,909,643 | A * | 6/1999 | Aihara ..................... 455/127.3 |
| 6,069,526 | A | 5/2000 | Ballantyne |
| 6,091,966 | A | 7/2000 | Meadows |
| 6,271,722 | B1 | 8/2001 | Ballantyne |
| 6,288,608 | B1 | 9/2001 | Jadus et al. |
| 6,603,359 | B2 | 8/2003 | Fujiwara et al. |
| 6,700,439 | B2 * | 3/2004 | Jackson .......................... 330/9 |
| 6,738,432 | B2 | 5/2004 | Pehlke et al. |
| 6,781,455 | B2 | 8/2004 | Kim |
| 6,900,692 | B2 * | 5/2005 | Kim et al. ..................... 330/51 |
| 6,960,959 | B2 | 11/2005 | Komatsu et al. |
| 7,157,966 | B2 | 1/2007 | Baree et al. |

| | | | |
|---|---|---|---|
| 2004/0056711 | A1 | 3/2004 | Apel, Jr. |
| 2004/0108900 | A1 | 6/2004 | Apel |
| 2004/0108901 | A1 | 6/2004 | Apel et al. |

(Continued)

FOREIGN PATENT DOCUMENTS

WO   WO 03/065598   8/2003

(Continued)

OTHER PUBLICATIONS

U.S. Appl. No. 11/042,623, filed Jan. 24, 2005, Apel et al., Amplifiers with High Efficiency in Multiple Power Modes.

(Continued)

*Primary Examiner*—Henry Choe
(74) *Attorney, Agent, or Firm*—Klarquist Sparkman, LLP

(57) ABSTRACT

Described herein are representative embodiments of amplifier bypass paths and amplifiers using such bypass paths. In certain exemplary embodiments, the amplifiers are operated as linear power amplifiers, such as may be used in wireless communications systems. According to one exemplary embodiment, an amplifier circuit is described comprising an amplifier path coupled between a first node and a second node. The amplifier path comprises one or more amplifiers. The circuit further comprises a bypass path coupled between the first node and the second node. The bypass path comprises two impedance inverting networks and a ground path that is selectively coupled to the bypass path at a third node located between the two impedance inverting networks. In this embodiment, the third node is configured to remain coupled to the two impedance inverting networks when the ground path is coupled to the bypass path.

33 Claims, 12 Drawing Sheets

U.S. PATENT DOCUMENTS

2004/0130391 A1    7/2004    Kim et al.
2005/0068101 A1    3/2005    Kim et al.
2005/0083117 A1    4/2005    Kim et al.
2005/0099227 A1    5/2005    Kim et al.
2006/0022755 A1    2/2006    Prodanov
2006/0103466 A1    5/2006    Shah et al.

OTHER PUBLICATIONS

"3V HBT GaAs CDMA 4×4mm Power Amplifier Module" TriQuint Semiconductor, TQM713019 Advance Data Sheet, 15 pp. (document marked Aug. 25, 2004).

"2.7V, Single-Supply, Cellular-Band Linear Power Amplifiers," Maxim Integrated Products, pp. 1-15 (document marked Feb. 2001).

Wongkomet et al., "Efficiency Enhancement Technique for RF CMOS Power Amplifier," 17 pp. (document downloaded from http://bwrc.eecs.berkeley.edu/Presentations/Retreats/Winter_Retreat_2004/Tuesday%20AM/Wongkomet_presentation_1_2004v2.ppt, on Aug. 15, 2005).

Zhao et al., "A 900 MHz Doherty Amplifier Implemented with Lumped Elements," 14 pp. (document downloaded from http://paworkshop.ucsd.edu/papers2003/YZhaoPAworkshop2003.ppt, on Aug. 15, 2005).

* cited by examiner

HIGH EFFICIENCY AMPLIFIER CIRCUITS HAVING BYPASS PATHS

TECHNICAL FIELD

The present application relates generally to power amplifiers such as may be used to amplify radio frequency (RF) signals.

BACKGROUND

In the past two decades, the market for wireless communication systems has shown unprecedented growth. In addition to the widespread proliferation of mobile phone services, wireless local area networks (WLANs) operating according to wireless standards such as IEEE 802.11a, IEEE 802.11b, IEEE 802.11g, and IEEE 802.16 are becoming more common. As the popularity of wireless systems increases, so does the demand for improved performance in the wireless transceivers supporting such systems.

One of the components in a wireless transceiver that can affect performance, particularly battery life and talk time, is the power amplifier. In general, power amplifiers for mobile transceivers can be divided into two groups: linear and saturated (non-linear). Generally speaking, a power amplifier operating in linear mode (referred to as a linear power amplifier) produces an output waveform having amplitudes that are directly proportional to the input waveform. Typically, the gain of this class of power amplifier remains fixed during operation and the output power is varied by varying the amplitude of the input waveform. For instance, a linear power amplifier may be preceded by a variable-gain amplifier (VGA). Linear amplification is typically used in transceivers to support signal processing methods such as Code Division Multiple Access (CDMA), Wide-band CDMA (W-CDMA), and Enhanced Data GSM Environment (EDGE) processing.

Power amplifiers operating in non-linear (saturated) mode (referred to as saturated power amplifiers) do not produce output waveforms that are directly proportional to the input waveforms. Instead, the output stage is driven on and off between a saturated state and an off state. Thus, a saturated power amplifier effectively operates as a switch and can be much more efficient than a linear amplifier. The output power in a saturated power amplifier generally varies with the supply voltage. Accordingly, for this class of power amplifier, the input power is typically fixed and either the supply voltage or the transistor bias voltages are varied to control gain, and thus the output power. Saturated power amplifiers are typically used in transceivers to support signal processing methods such as Group Speciale Mobile (GSM).

Because of the mobile nature of many wireless devices, the power amplification required for proper transmission is not necessarily constant. The power required for proper transmission is typically dependent on factors such as the distance of the handset to the corresponding base station or local terrain, and thus varies as the handset is transported from location to location. Consider, for example, a typical CDMA and GSM handset used in a cellular telephone network. Typical CDMA handsets are desirably capable of producing output powers of up to about +28 dBm, and typical GSM handsets are desirably capable of producing outputs power of up to about +34.5 dBm. The average output power that is necessary for such handsets, however, is far less than this maximum, and is generally closer to 0 dBm.

Further, GSM power amplifier modules are typically implemented with a controller (for example, a CMOS controller) used to modulate either the supply voltage or the base bias voltages in order to vary the gain of the amplifiers. A typical CMOS controller reduces excess voltage by dissipating it resistively. Consequently, lower-power operation can be very inefficient. For example, a typical saturated power amplifier with an efficiency of 55% at maximum output power is only about 24% efficient when the output power is reduced by 6 dB. Efficient operation at multiple power levels down to 0 dBm is therefore desirable for both linear and saturated amplifier applications, particularly for battery operated, mobile devices.

Conventional methods of implementing multi-power-mode amplifier functionality have traditionally involved complex switching arrangements. For example, U.S. Pat. No. 6,603,359 describes a multiple power mode power amplifier having a bypass circuit with a first bypass delay line having a line length of a quarter wavelength and a second bypass delay line having a line length of a quarter wavelength. The described bypass circuit further includes a switch circuit having three on-off contact switches. In particular, the switch circuit has a first on-off contact interposed between the bypass delay lines, a second on-off contact interposed between a grounding line and the connection between one side of the first contact and the first bypass delay line, and a third on-off contact interposed between a grounding line and the connection between another side of the first contact and the second delay line. When the first on-off contact is opened, the second and third contacts are closed, and when the first on-off contact is closed, the second and third contacts are opened. This complex switching arrangement completely isolates the bypass delay lines from one another during high-power operation by breaking the signal path through the switching circuit. The switch circuit and corresponding control circuitry, however, require significant amounts of hardware to implement this functionality. Moreover, the lengths of the bypass delay lines in the described design also require significant amounts of area in the overall design. Accordingly, the overall area required to implement the described bypass circuit is undesirably large, especially in view of today's demand for smaller power amplifier sizes. Further, in low-power operation, the switch circuit continuously draws a current in order to close the first on-off contact. Consequently, the switch circuit will exhibit undesirable power dissipation in low-power operation.

International Publication No. WO 03/065598 A1 describes a power amplifier having a variable gain amplifier, a first impedance matching unit, a second impedance matching unit, a power stage, a power stage output matching unit, an impedance transformer, and a switch. The switch in the described power amplifier is connected in parallel to the power stage to bypass the power stage according to the mode determined by the output power level. In high output power mode, the switch is closed and the first impedance matching unit and the second impedance matching unit are interoperated to constitute an interstage matching circuit. Thus, in the high output power mode, the second impedance matching unit and the path to ground created by closure of the switch are used as part of the interstage impedance match. The impedance and phase shift through the second impedance matching unit are thus constrained by matching requirements at the node where the bypass path begins.

Other multi-mode power amplifiers use bypass paths that exclude switches or other active elements of variable impedance or resistance altogether. For example, U.S. Pat. No. 6,900,692 and U.S. Patent Application Publication No. 2005/0083117 describe a multiple power mode power amplifier that does not use any switches and that is free from external control circuits provided to control the switches. The described amplifier has a driver for amplifying input power, a power stage for receiving power amplified by the driver through a first impedance matching unit connected to the driver and through a second impedance matching unit connected to the first impedance matching unit, and an applied voltage control circuit connected to the power stage for controlling applied voltages corresponding to a low-power mode and a high-power mode. The described amplifier further has an impedance transformer on a bypass arm for receiving power amplified by the driver through the first impedance matching unit and transferring the power to a fourth impedance matching unit. The described design also has a third impedance matching unit connected in series to the power stage for transferring power amplified by the power stage to the fourth impedance matching unit. The described amplifier requires a compromise in insertion losses between the high- and low-power modes. Consequently, in high-power mode, the described amplifier operates with reduced efficiency. Further, because of the inherent insertion losses in the design, higher amplifier gain (and thus more power) is required in both modes. Moreover, because the bypass arm is not highly isolated from the amplified path during high-power operation, the amplifier can be unstable due to signal feedback through the bypass arm. In fact, because phase shift changes with frequency, in high-power mode the undesired energy coupled through the bypass arm can also result in amplitude and phase distortions to the desired signal. Still further, because the bypass arm produces a frequency dependent load on the output, it is difficult to achieve desirable harmonic performance in implementations of the design.

Accordingly, there exists a need for improved amplifiers that are compact and that can operate with enhanced efficiency in multiple power modes, thereby providing the necessary peak power in one mode and efficient, low-power operation in another.

DETAILED DESCRIPTION

Figure 1:
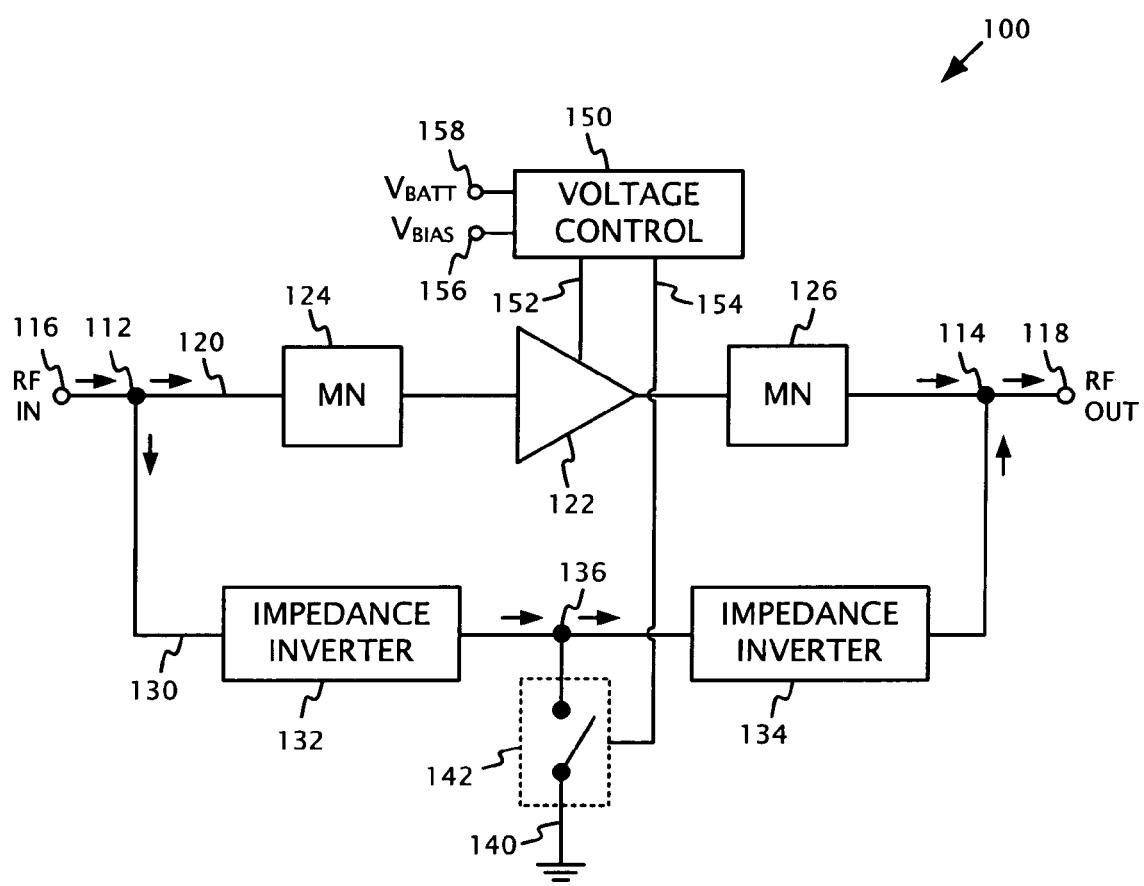
FIG. 1 is a schematic block diagram of an amplifier section in accordance with a first exemplary embodiment of the disclosed technology.

As used in this application and in the claims, the singular forms "a," "an," and "the" include the plural forms unless the context clearly dictates otherwise. Additionally, the term "includes" means "comprises." Further, the term "coupled" means electrically or electromagnetically connected or linked and does not exclude the presence of intermediate elements between the coupled items.

Disclosed below are representative embodiments of an amplifier circuit that may be used, for example, as part of a wireless communication system. For example, any of the disclosed embodiments can be used as an amplifier stage (for example, a final amplifier stage) in an RF transceiver front end as may be used in a mobile handset, such as a CDMA or GSM handset. Also disclosed herein are exemplary methods by which the embodiments can operate or be operated. Exemplary environments and applications for the disclosed embodiments are also disclosed. For example, the disclosed embodiments can be used in a variety of applications that involve the amplification of RF signals over a range of power levels. The described systems, apparatus, and methods should not be construed as limiting in any way. Instead, the present disclosure is directed toward all novel and nonobvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. For example, although any of the disclosed embodiments may be implemented as part of an RF transceiver in a wireless communication system (for example, in a cellular telephone handset, such as a CDMA handset), other components of the RF transceiver are well known in the art and are not described in further detail. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

The disclosed embodiments can be implemented in a wide variety of circuits and systems (for example, application-specific integrated circuits (ASICs), systems-on-a-chip (SOCs), systems in a package (SIPs), systems on a package (SOPs), multi-chip modules (MCMs), or other such devices). The various components of the disclosed embodiments can be implemented (separately or in various combinations and subcombinations with one another) using a variety of different semiconductor materials, including but not limited to: gallium arsenide (GaAs) and GaAs-based materials (AlGaAs, InGaAs, AlAs, InGaAlAs, InGaP, InGaNP, AlGaSb, and the like); indium phosphide (InP) and InP-based materials (InAlP, InGaP, InGaAs, InAlAs, InSb, InAs, and the like); silicon (Si), strained silicon, germanium (Ge) and silicon- and germanium-based materials (SiGe, SiGeC, SiC, $SiO_2$, high dielectric constant oxides, and the like) such as complementary metal-oxide-semiconductor (CMOS) processes; and gallium nitride materials (GaN, AlGaN, InGaN, InAlGaN, SiC, Sapphire, Si, and the like). In certain embodiments, for example, the amplifier section is implemented on a single chip. The disclosed embodiments can also be implemented using combinations of these process technologies (for example, on multiple chips or on a single chip). The disclosed embodiments can also be implemented using a variety of different off-chip processes, including but not limited to low- or high-frequency printed circuit board (PCB) processes, thick- or thin-film hybrid processes, multi-layered organic processes, and low-temperature cofired ceramic (LTCC) processes.

Similarly, a variety of transistor technologies can be used to implement the disclosed embodiments. For example, the disclosed amplifier embodiments can be implemented using bipolar junction transistor (BJT) technologies (for example, heterojunction bipolar junction transistors (HBTs)) or field effect transistor (FET) technologies (for example, pseudomorphic high electron mobility transistors (pHEMTs)). Combinations or subcombinations of these technologies or other transistor technologies can also be used to implement the disclosed circuit embodiments. Such combinations may be implemented on multiple chips or a single chip. For example, in one exemplary embodiment, one or more pHEMTs transistors are implemented on the same chip as one or more heterojunction bipolar transistors (HBTs).

The example amplifier sections, control circuits, and switching mechanisms can be included in a variety of wireless devices. For example, any of the amplifier embodiments described herein can be implemented as part of an amplifier module used in mobile devices such as cell phones, personal digital assistants, mobile media players, laptop computers, and pagers to provide improved battery life. Devices based on wireless standards such as 802.11a, 802.11b, 802.11g, 802.16, and BLUETOOTH may also include such amplifier modules. Other devices (both fixed and mobile) that use wireless communications such as keyboards, pointing devices, media distribution devices, and desktop computers can also include such amplifier modules. In a representative example, a cell phone or mobile station can include a control circuit configured to provide a power-mode-control signal or high/low-control signal to select an operational mode of an amplifier that includes a bypass path and an amplification path. Other wireless devices can be similarly configured. Other applications for the disclosed embodiments include WLAN systems, wireless systems using TDMA or EDGE modulation techniques, and other such systems.

FIG. 1 is a schematic block diagram illustrating an exemplary amplifier section 100 according to an embodiment of the disclosed technology. The amplifier section 100 comprises a first path 120 coupled between a first node 112 and a second node 114 and a second path 130 also coupled between the first node 112 and the second node 114. In the illustrated embodiment, the first node 112 comprises a three-port node coupled to an input node 116 configured to receive an input signal (for example, an RF signal), an upstream end of the first path 120, and an upstream end of the second path 130. In some embodiments, for example, the input node is coupled to a prior amplification stage (for instance, a variable gain amplifier (VGA) in embodiments using linear amplifiers). The second node 114 also comprises a three-port node coupled to an output node 118 configured to drive a downstream load (for example, an RF antenna section), a downstream end of the first path 120, and a downstream end of the second path 130. (For purposes of this disclosure, respective ends of a path or circuit element are sometimes identified relative to the desired direction of signal propagation along the path, which is shown by the arrows in the figures. Thus, the "upstream" end of a path or circuit element refers to the end at which a signal begins, whereas the "downstream" end of a path or element refers to the end to which the signal desirably propagates.)

The first path 120 includes an amplifier subsection 122 comprising one or more amplifiers. For this reason, the first path 120 is sometimes referred to as the "amplifier path" or "amplification path." The amplifier subsection 122 can comprise, for example, one or more transistors configured to operate as linear amplifiers (for example, as deep class AB amplifiers, approaching class B amplifiers) or as saturated amplifiers (for example, as class D, E, or F amplifiers). In certain embodiments, the amplifier subsection 122 comprises multiple parallel-connected transistors, such as multiple heterojunction bipolar transistors (HBTs). In the illustrated embodiment, the first path 120 further comprises an input impedance matching network 124 and an output impedance matching network 126. According to one exemplary embodiment, the input impedance matching network 124 is configured to substantially match the impedance at the input of the amplifier 122 with the impedance at the node 112 when the amplifier subsection 122 is in operation. Similarly, the output impedance matching network 126 is configured to substantially match the impedance at the output of the amplifier 122 with the impedance at the node 114 when the amplifier subsection 122 is in operation.

The second path 130 comprises one or more impedance inverters (or impedance inverting networks). For example, the illustrated embodiment comprises a first impedance inverter 132 and a second impedance inverter 134. In general, an impedance inverter can be characterized as a circuit portion configured to produce an impedance at one end of the inverter that is inversely related to an impedance at the other end of the inverter. Thus, when an impedance inverter is in a circuit path driving a load, the impedance at the input of the impedance inverter is inversely related to the impedance of the load coupled to the output of the impedance inverter.

In particular embodiments of the amplifier section of FIG. 1 (or any other amplifier embodiment disclosed herein), the impedance inverters are configured to operate substantially in accordance with the equation, $ZN_{INV}^2 = Z_{IN} \times Z_{OUT}$, where $Z_{INV}$ is the characteristic impedance of the impedance inverter, $Z_{IN}$ is the impedance at the input of the impedance inverter, and $Z_{OUT}$ is the load impedance at the output of the impedance inverter. The impedance inverters 132, 134 of FIG. 1 (or in any of the architectures disclosed herein) can be implemented in a variety of manners. For example, in certain embodiments, one or more of the impedance inverters are implemented as quarter-wavelength transmission lines (also referred to as λ/4 transmission lines). In other embodiments, however, one or more of the impedance inverters are implemented as lumped-element circuit portions that operate in a substantially equivalent manner as quarter-wavelength transmission lines over the frequency range of interest. Such lumped-element circuit portions can comprise for example, combinations of inductance and capacitance elements and generally require less area than a corresponding quarter-wavelength transmission line. For instance, in particular embodiments, the impedance inverters are implemented as shunt-C, series-L, shunt-C networks. In still other embodiments, the impedance inverters are implemented using other circuit elements, such as transformers.

The second path 130 further comprises one or more nodes (or junctions) selectively coupled to a circuit path of lower impedance, such as a ground path. In the illustrated embodiment, a node 136 is effectively located between the impedance inverters 132, 134 and is selectively coupled to a ground path 140. In the illustrated embodiment, when the node 136 is decoupled from the ground path 140, the node 136 sees substantially an open circuit along the ground path 140 and the three-port node 136 effectively becomes a two-port node. The node 136 of FIG. 1 is selectively coupled the ground path 140 by a switch 142. Although only one switch 142 is illustrated, multiple additional switches can be implemented on the ground path 140. In some embodiments, the switch 142 comprises or operates effectively as a single-pole single-throw switch. For instance, in particular embodiments, the switch 142 is implemented as a diode, such as a PIN diode, or a transistor. The switch can alternatively comprise other electrical components that selectively connect and disconnect the node 136 to the ground path 140. For example, the switch 142 can be implemented using pHEMT, CMOS, or microelectromechanical system (MEMS) switching technology.

Because the second path 130 in the illustrated embodiment is a secondary path around the amplifier path 120, it is sometimes referred to as a "bypass path." Further, in the illustrated embodiment, the bypass path 130 does not include any amplification elements. In other embodiments (or in any other amplifier embodiment disclosed herein), the bypass path 130 may include one or more amplifiers (such as one or more HBT cells) and further include any necessary impedance matching networks or amplifier control networks.

The amplifier section 100 can be configured to operate in multiple power modes to provide different levels of power gain and power consumption. For example, the amplifier subsection 122 and the switch 142 can be controllable via one or more control signals on control lines 152, 154 provided by a voltage control system 150. The voltage control system 150 can be configured, for instance, to apply a predetermined or variable DC bias voltage to transistors of the amplifier subsection 122 and a predetermined or variable voltage to the switch 142 in response to a control signal at a control node. In the illustrated implementation, for example, the voltage control system 150 applies predetermined control signals in response to the single-bit control signal ($V_{BIAS}$) at control node 156 of the voltage control system 150. As more fully explained below, the control signal $V_{BIAS}$ at the control node 156 is used to operate the amplifier section 100 in either a high-power mode of operation (for example, when $V_{BIAS}$ is high) or a low-power mode of operation (for example, when $V_{BIAS}$ is low).

According to one exemplary embodiment, in a high-power mode, the switch 142 is closed to couple the node 136 to the ground path, thereby creating a low shunt impedance at the node 136. This low impedance is transformed by the impedance inverters 132, 134 into a high impedance at respective opposite ends of the impedance inverters 132, 134. Thus, a high impedance appears at the upstream end of the first impedance inverter 132 seen from the first node 112, and a high impedance appears at the downstream end of the second impedance inverter 134 seen from the second node 114. In the high-power mode, the amplifier subsection 122 is also activated (for example, biased on by a DC bias voltage). Thus, the input signal from the input node 116 can be amplified in the amplifier path 120 with low signal loss into the bypass path 130. Further, the high impedance at the downstream end of the second impedance inverter 134 increases the stability of the amplifier section 100 by helping to prevent loop oscillations that may result from feedback from the output of the amplifier subsection 122 back through the bypass path 130. In addition, the low impedance at the node 136 helps provide isolation between the nodes 112, 114 through the bypass arm in the high-power mode, further increasing the stability of the amplifier section 100. Moreover, in the high-power mode, the input matching network 124 and the output matching network 126 are not affected substantially by the frequency dependent impedance of the bypass path 130.

In the low-power mode, the switch 142 is open and decouples the node 136 from the ground path 140. Thus, the ground path 140 appears effectively as an open circuit at the node 136, and the three-port node effectively becomes a two-port node. Further, in some embodiments, if the source impedance at the input node 116 is $Z_{IN}$ and the load impedance at the output node 118 is $Z_{OUT}$, the impedance inverters 132, 134 can be chosen substantially according to the following relationship:

$$\frac{Z_{OUT}}{Z_{IN}} = \frac{Z_{INV2}^2}{Z_{INV1}^2} \qquad (1)$$

where $Z_{INV1}$ and $Z_{INV2}$ are the characteristic impedances of inverters 132, 134, respectively. Using the relationship of Equation (1), the inverters can be configured to create an impedance transformation that results in substantially lossless transmission between the nodes 112, 114 during low-power mode operation. Further, in the low-power mode, the amplifier subsection 122 is deactivated (for example, biased off by a DC bias voltage) so that the amplifier subsection 122 effectively appears as an open circuit on the amplification path 120. Consequently, the input signal from the input node 116 will be transmitted through the bypass path 130 with little energy coupled into the amplifier path 120 at the nodes 112, 114.

In the low-power mode, and according to one exemplary embodiment, the phase shift through each of the impedance inverters 132, 134 is substantially 90°. Thus, the combined phase shift through the bypass path 130 is substantially 180°. Typically, the phase shift through a single power amplifier stage is approximately 180°. Thus, in embodiments in which the amplifier subsection 122 is a single gain stage, the phase shift of a signal propagating from the input node 112 to the output node 114 of the amplifier section 100 is substantially the same in both low- and high-power modes. In other representative examples, the impedance inverters and power amplifier stages can have different phase shifts. By contrast, if the impedance inverter 132 were replaced by an impedance matching unit used as part of the input matching network for the high-power mode, an undesirable phase shift would be created when alternating between low and high power modes. Phase changes between low and high-power modes can be deleterious in many applications. As shown by Equation (1), the respective characteristic impedances of the impedance inverters 132, 134 in the bypass path 130 can be configured to provide any desired impedance transformation from the node 112 to the node 114 in the low-power mode. Therefore, the bypass path 130 can operate as a low-loss path during low-power operation. In other words, the bypass path can comprise two or more circuit portions that individually act substantially as quarter-wavelength transmission lines and that in combination provide substantially an impedance match between the input and the output nodes of the bypass path. Further, in some embodiments, the switch 142 is configured to consume little (for example, less than 1 mA) or no current in the low-power mode, further enhancing the low-loss characteristics of the bypass path 130. In the illustrated embodiment, the voltage control system 150 can further apply a supply voltage to the amplifiers of the amplifier subsection 122 (for example, $V_{BATT}$ applied at supply node 158).

In the illustrated embodiment, no other switches are used along the bypass path 130. Consequently, the hardware overhead used to implement the amplifier section 100 is small, thereby allowing the architecture to be implemented in a small area. For example, embodiments of the amplifier section 100 (or any amplifier embodiment disclosed herein) can be implemented as part of a 4×4-mm² or 3×3-mm² power amplifier module, such as a CDMA or GSM power amplifier module. Further, by using a single switch, the multi-mode control of the amplifier section is simplified. Still further, in some designs, little or no current is consumed during operation of the amplifier section in low power mode.

Figure 2:
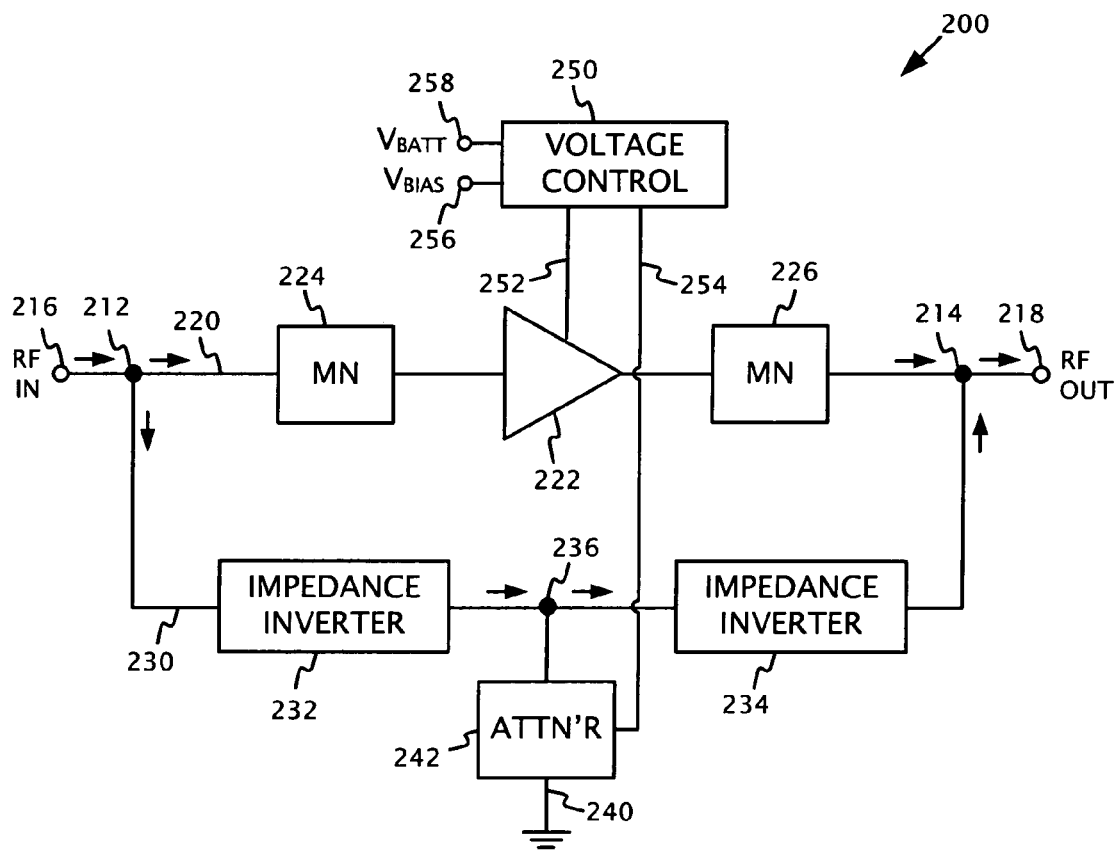
FIG. 2 is a schematic block diagram of an amplifier section in accordance with a second exemplary embodiment of the disclosed technology.

FIG. 2 is a schematic block diagram illustrating an embodiment of an amplifier section 200 that uses a variable attenuator on a bypass path. The amplifier section 200 comprises an amplification path 220 coupled between a first node 212 and a second node 214, and a bypass path 230 also coupled between the first node 212 and the second node 214. In the illustrated embodiment, the first node 212 is coupled to an input node 216 configured to receive an input signal (for example, an RF signal), and the second node 214 is coupled to an output node 218 configured to drive a downstream load (for example, an RF antenna section).

The amplification path 220 comprises an amplifier subsection 222 comprising one or more amplifiers (for example, multiple parallel-connected transistors, such as HBTs). In the illustrated embodiment, the amplification path 220 further comprises an input impedance matching network 224 and an output impedance matching network 226 respectively configured to substantially match the impedance at the input of the amplifier subsection 222 with the impedance at the first node 212 and the impedance at the output of the amplifier subsection 222 with the impedance at the second node 214 when the amplifier subsection 222 is in operation.

The bypass path 230 comprises one or more impedance inverters. For example, the illustrated embodiment comprises a first impedance inverter 232 and a second impedance inverter 234. The bypass path 230 also comprises one or more nodes (or junctions) coupled to a circuit path that can be configured to have a lower impedance. In the illustrated embodiment, for instance, node 236 is effectively located between the impedance inverters 232, 234 and is coupled to a ground path 240 having a variable attenuator 242. The variable attenuator (or variable resistor) 242 can be selectively adjusted to vary the impedance of the ground path 240 seen by the node 236. The attenuator 242 can be implemented in a variety of manners. For example, the attenuator 242 may comprise one or more serially coupled transistors having resistances that can be controlled by varying the base-emitter voltage (for BJT-type transistors) or the gate-source voltage (for FET-type transistors). The attenuator 242 can alternatively comprise one or more varactors.

In the illustrated embodiment, and as more fully discussed above with respect to the embodiment illustrated in FIG. 1, a voltage control system 250 operates the amplifier section 200 in multiple power modes. The illustrated control system 250 is coupled to the amplifier subsection 222 via control line 252 and to the attenuator 242 via control line 254. The control system 250 can comprise a voltage network configured to apply a variable or predetermined bias voltage to the amplifier subsection 222 and a variable or predetermined voltage to a control region of the attenuator 242. In the illustrated embodiment, the control system 250 operates in response to a one-bit control signal ($V_{BIAS}$) at control node 256, which selectively operates the amplifier section 200 in two modes: a low-power mode and a high-power mode. In one exemplary embodiment, in the high-power mode, the control system 250 biases the amplifier subsection 222 on and provides a control voltage to the attenuator 242 that produces a low impedance on the ground path 240. This low impedance is transformed by the impedance inverters 232, 234 into high impedances at respective opposite ends of the impedance inverters 232, 234, thereby allowing power to flow through the amplifier path 220 with little energy coupled into the bypass path 230. In the low-power mode, the control system 250 biases the amplifier subsection 222 off and provides a control voltage to the attenuator 242 that produces a relatively high impedance on the ground path 240. This higher impedance of the ground path 240 seen at the node 236 allows a controlled amount of power to flow from impedance inverter 232 to 234, thereby allowing power to flow through the bypass path 220 with a desired insertion loss into the amplifier path 220. Further, the impedance inverters 232, 234 can be configured to have respective characteristic impedances $Z_{INV}$ that create substantially an impedance match between the node 212 and the node 214 when the low-power (or low-loss) mode is selected. Thus, the bypass path 230 can operate as a low loss path during low-power operation. The voltage control system 250 can be further configured to apply a supply voltage to the amplifiers of the amplifier subsection 222 (for example, $V_{BATT}$ applied at supply node 258).

Figure 3:
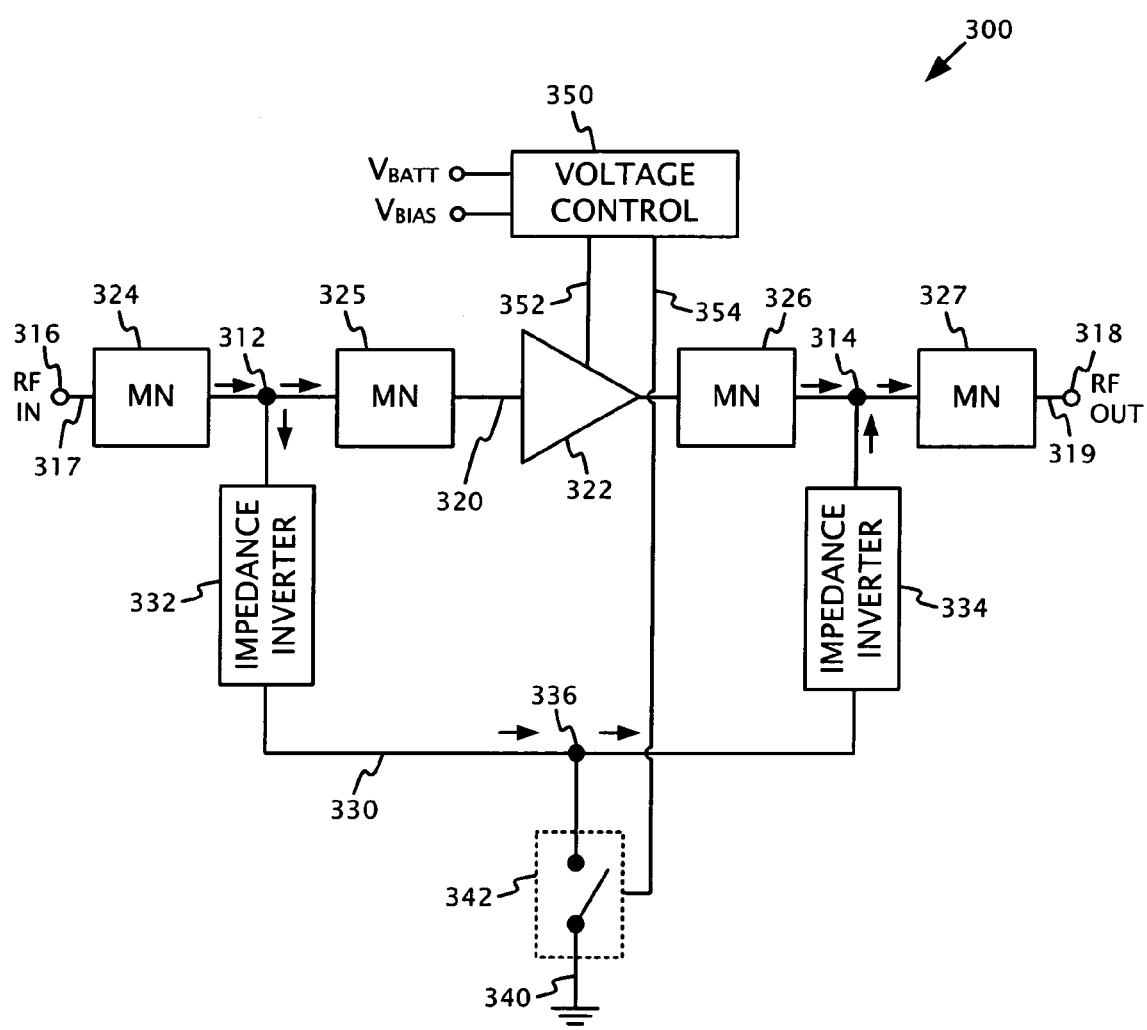
FIG. 3 is a schematic block diagram of an amplifier section in accordance with a third exemplary embodiment of the disclosed technology.

FIG. 3 is a schematic block diagram illustrating an embodiment of an amplifier section 300 wherein the nodes at the ends of a bypass path are positioned between (or split) respective impedance matching networks. The amplifier section 300 comprises an amplification path 320 coupled between a first node 312 and a second node 314, and a parallel bypass path 330 also coupled between the first node 312 and the second node 314. In the illustrated embodiment, the first node 312 comprises a three-port node coupled to a downstream end of an input path 317 configured to receive an input signal at an input node 316. The second node 314 comprises a three-port node coupled to an upstream end of an output path 318 configured to drive a downstream load at an output node 318.

The amplification path 320 includes an amplifier subsection 322 comprising one or more amplifiers (for example, multiple parallel-connected transistors, such as HBTs). In the illustrated embodiment, the input path 317 comprises a first impedance matching network 324, and the amplification path 320 comprises a second impedance matching network 325 before the input of the amplifier subsection 322. The amplification path 320 further comprises a third impedance matching network 326 after the output of the amplifier subsection 322, and the output path 319 comprises a fourth impedance matching network on the output path 327.

The bypass path 330 comprises a first impedance inverter 332 and a second impedance inverter 334. The bypass path 330 further comprises one or more nodes (or junctions) coupled to a circuit path that can be selectively coupled to a ground path (or other path of lower impedance) or that has a variable impedance. For example, in the illustrated embodiment, a node 336 is located between the impedance inverters 332, 334 and is selectively coupled to a ground path 340 by a switch 342 as in the embodiment discussed above with respect to FIG. 1. For instance, the switch 342 can be or effectively be a single-pole single-throw switch (for example, a PIN diode), an attenuator, or other switching or attenuating device.

In the illustrated embodiment, a control system 350 operates the amplifier section 300 in multiple power modes as described above with respect to FIG. 1. In one exemplary embodiment, for instance, the amplifier section 300 operates in a high-power mode and a low-power mode. In a high-power mode, for example, the control system 350 biases the amplifier subsection 322 on and closes the switch 342, creating a low impedance at the node 336 that is transformed into high impedances at the respective opposite ends of the impedance inverters 332, 334 seen by the nodes 312, 314. Thus, in high-power mode, power flows through the amplifier path 320 with little energy coupled into the bypass path 330. In the low-power mode, the control system 350 biases the amplifier subsection 322 off and opens the switch 342, creating a high impedance at the node 336. The impedance inverters 332, 334 can be configured to provide substantially an impedance match between nodes 312, 314 in order to enable power to flow through the bypass path 330 with little energy coupled into the amplifier path 320.

According to one exemplary embodiment, the first and second impedance matching networks 324, 325 are configured to substantially match the impedance at the input of the amplifier subsection 322 with the impedance at the input node 316 when the amplifier subsection 322 is activated and the amplifier section 300 is operated in the high-power mode of operation. Similarly, the third and fourth impedance matching networks 326, 327 are configured to substantially match the impedance at the output of the amplifier subsection 322 with the impedance at the output node 318 when the amplifier subsection 322 is activated and the amplifier section 300 is operated in the high-power mode of operation.

Figure 4:
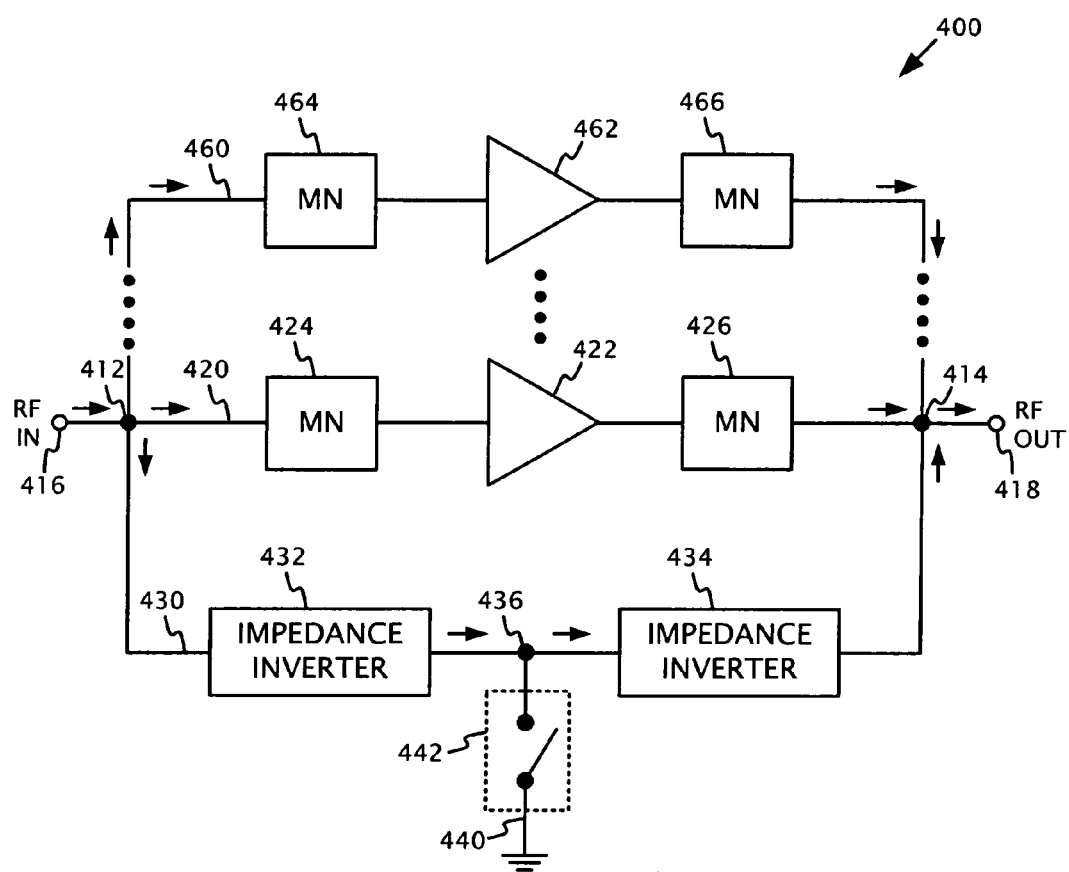
FIG. 4 is a schematic block diagram of an amplifier section in accordance with a fourth exemplary embodiment of the disclosed technology.

FIG. 4 is a schematic block diagram illustrating an embodiment of an amplifier section 400 comprising multiple amplification paths and a nonamplified bypass path. The amplifier section 400 comprises a first amplification path 420 coupled between a first node 412 and a second node 414. The amplifier section 400 further comprises a bypass path 430 also coupled between the first node 412 and the second node 414. In this embodiment, the amplifier section 400 additionally comprises one or more additional amplification paths 460 also coupled between the first node 412 and the second node 414. In the illustrated embodiment, the first node 412 is further configured to receive an input signal from an input node 416, and the second node 414 is further configured to drive a downstream load at output node 418. It should be understood that the multiple additional amplification paths 460 are shown as being coupled to the first node 412 and the second node 414 for illustrative purposes only and that the additional amplification paths 460 can be coupled to the input port 416 and the output 418 in various other manners so that the desired operation of the amplifier section 400 is still achieved.

The amplification paths 420, 460 comprise respective amplifier subsections 422, 462, each comprising one or more amplifiers (for example, multiple parallel-connected transistors, such as HBTs). In the illustrated embodiment, the amplification paths 420, 460 further include respective input impedance matching networks 424, 464 and respective output impedance matching networks 426, 466. The amplification paths 420, 460 may further comprise additional circuit elements (not shown) configured to isolate the respective amplification paths from the other signal paths during amplifier section operation. For example, the amplification paths 420, 460 can comprise one or more switches configured to selectively connect the respective paths to the input node 416 and the output node 418. Further, the amplification paths 420, 460 can comprise one or more impedance inverters configured to provide path isolation from the other paths when they are deactivated. For example, any of the multi-mode amplifier designs described in U.S. Patent Application Publication No. 2004/0108901 or in U.S. patent application Ser. No. 11/042,623 can be used in the amplifier section 400 or in connection with any of the amplifier embodiments described herein. U.S. Patent Application Publication No. 2004/0108901 and U.S. patent application Ser. No. 11/042,623 are hereby incorporated herein by reference.

In the embodiment illustrated in FIG. 4, the bypass path 430 comprises a first impedance inverter 432 and a second impedance inverter 434. The bypass path 430 further comprises one or more nodes (or junctions) coupled to a circuit path that can be selectively coupled to a ground path (or other path of lower impedance) or that has a variable impedance. For example, in the illustrated embodiment, a node 436 is located between the impedance inverters 432, 434 and is selectively coupled to a ground path 440 by a switch 442 as in the embodiments discussed above with respect to FIG. 1. For instance, the switch 442 can be or effectively be a single-pole single-throw switch (for example, a PIN diode), an attenuator, or other switching or attenuating device.

In the illustrated embodiment, a control system (not shown) operates the amplifier section 400 in multiple power modes. For instance, in one exemplary embodiment consisting of the first amplification path 420 and one additional amplification path 460, the amplifier section 400 can be operated in a high-power mode, an intermediate-power mode, and a low-power mode. In the high-power mode, for instance, only the amplifier subsection 462 can be activated and the switch 442 closed. In the intermediate-power mode, only the amplifier subsection 422 can be activated and the switch 442 closed. In the low-power mode, both of the amplifier subsections 422, 462 can be deactivated and the switch 442 opened.

Figure 5:
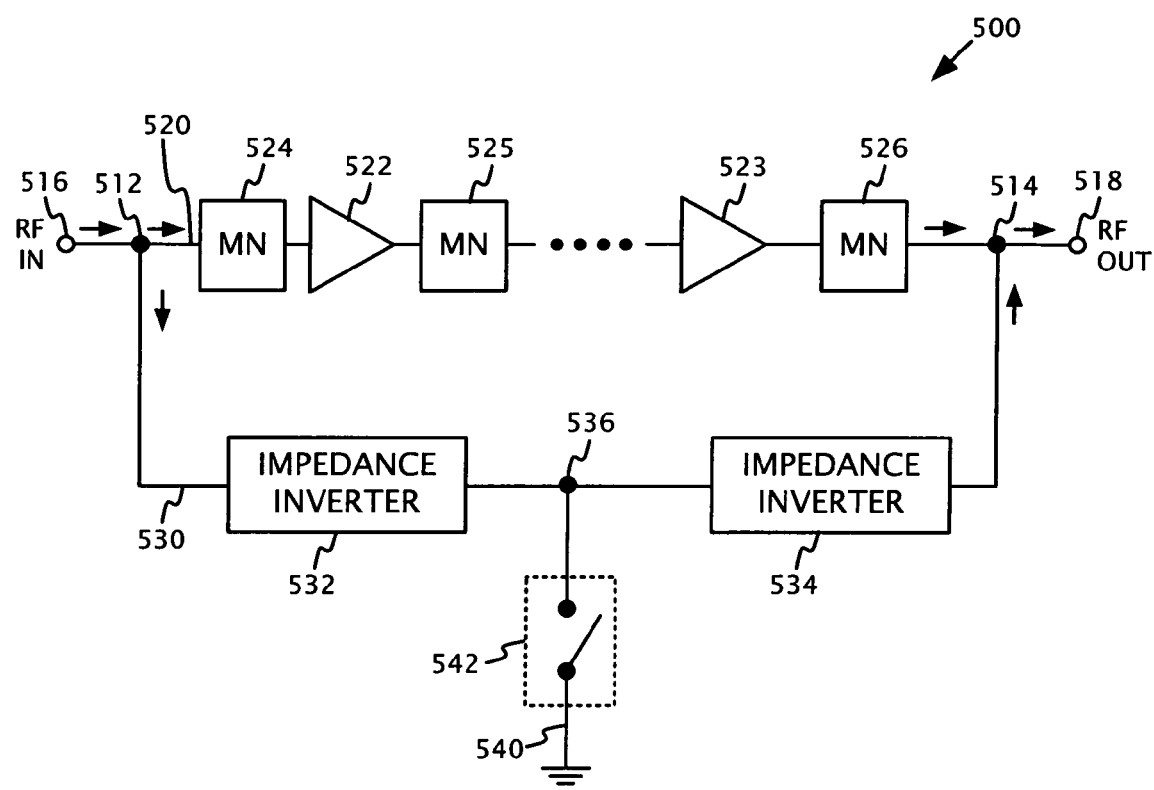
FIG. 5 is a schematic block diagram of an amplifier section in accordance with a fifth exemplary embodiment of the disclosed technology.

FIG. 5 is a schematic block diagram illustrating an embodiment of an amplifier section 500 wherein the amplification path comprises multiple serially coupled amplifiers.

The amplifier section 500 comprises an amplification path 520 coupled between a first node 512 and a second node 514, and a parallel bypass path 530 also coupled between the first node 512 and the second node 514. In the illustrated embodiment, the first node 512 comprises a three-port node coupled to an input node for receiving an input signal (for example, an RF signal). The second node 514 comprises a three-port node coupled to an output node 518 for driving a downstream load (for example, an antenna section).

The amplification path 520 comprises multiple serially coupled amplifier subsections, which each comprises one or more amplifiers (such as multiple parallel-coupled HBTs). In the illustrated embodiment, for instance, the amplification path 520 comprises a first amplifier subsection 522 and a second amplifier subsection 523. The amplification path 520 further comprises an input impedance matching network 524, an intermediate matching network 525, and an output impedance matching network 526. The amplification path 520 may further include one or more additional amplifier subsections and accompanying matching networks (not shown, but indicated by the ellipses in the figure).

The bypass path 530 comprises a first impedance inverter 532 and a second impedance inverter 534. The second path 530 further comprises one or more nodes (or junctions) coupled to a circuit path that can be selectively coupled to a ground path (or other path of lower impedance) or that has a variable impedance. For example, in the illustrated embodiment, a node 536 is located between the impedance inverters 532, 534 and is selectively coupled to a ground path 540 by a switch 542. For instance, the switch 542 can be or effectively be a single-pole single-throw switch (for example, a PIN diode), an attenuator, or other switching or attenuating device.

In the illustrated embodiment, a control system (not shown) operates the amplifier section 500 in multiple power modes. For instance, in one exemplary embodiment, the amplifier section 500 can be operated in a high-power mode, and a low-power mode. In the high-power mode, for instance, the respective amplifier subsections 522, 523 can be activated and the switch 542 closed, thereby creating a low-loss path through the amplifier path 520. In the low-power mode, both of the amplifier subsections 522, 523 can be deactivated and the switch 542 opened, thereby creating a low-loss path through the bypass path 530. In other embodiments, the amplifier section 500 can be operated in multiple additional power modes. For example, the amplifier subsections along the first path 520 can be individually controlled and selectively deactivated to provide various other possible power levels. In such embodiments, additional bypass paths (such as any of the bypass paths described herein) can be included in the amplifier architecture to allow the RF signal to bypass any deactivated amplifier subsection. For example, one or more additional bypass paths can be "nested" within the amplifier path 520, thereby allowing additional power modes to be enabled.

Figure 9:
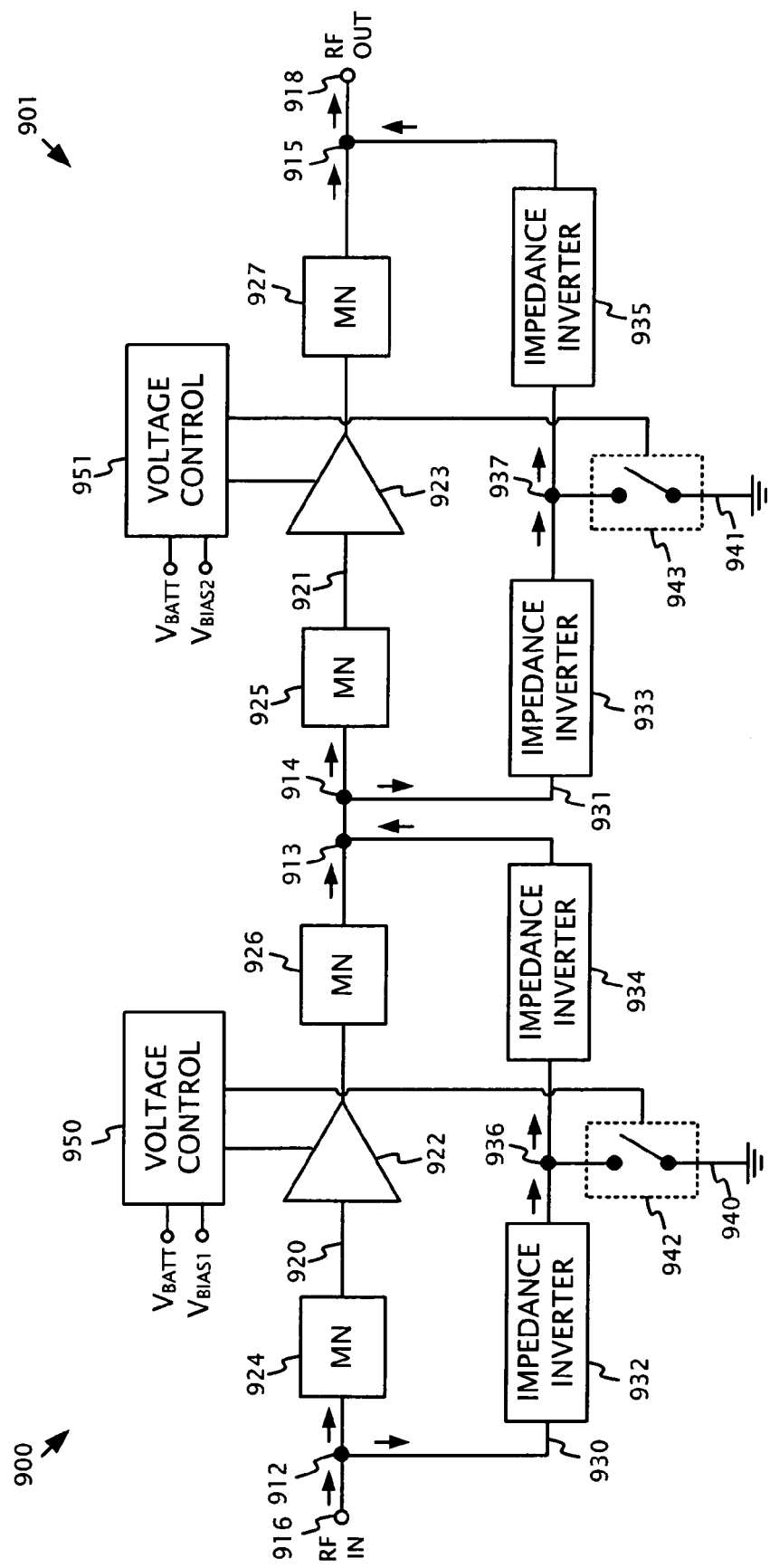
FIG. 9 is a schematic block diagram of an amplifier section in accordance with a sixth exemplary embodiment of the disclosed technology.

FIG. 9 is a schematic block diagram illustrating an embodiment of an amplifier section 900 comprising multiple serially coupled amplifier sections having respective amplifier paths and bypass paths. Amplifier section 900 comprises a first amplification path 920 coupled between a first node 912 and a second node 913. The first amplifier section 900 further comprises a first bypass path 930 also coupled between the first node 912 and the second node 913. In the illustrated embodiment, the first node 912 is further configured to receive an input signal from an input node 916, and the second node 913 is further configured to drive a second amplifier section 901, which in the illustrated embodiment is substantially similar to the first amplifier section 900. Amplifier section 901 comprises a second amplification path 921 coupled between a third node 914 and a fourth node 915. Although the second and third nodes 913, 914 are shown as separate nodes in the illustrated embodiment, they may comprise a single node. The second amplifier section 901 further comprises a bypass path 931 also coupled between the third node 914 and the fourth node 915. In the illustrated embodiment, the fourth node 915 is further configured to drive a downstream load at output node 918. It should be understood that the illustrated amplifier sections 900, 901 can be further coupled to additional amplifier sections or can alternatively comprise any of the other amplifier embodiments described herein.

The amplification paths 920, 921 comprise respective amplifier subsections 922, 923, each comprising one or more amplifiers (for example, multiple parallel-connected transistors, such as HBTs). In the illustrated embodiment, the amplification paths 920, 921 further include respective input impedance matching networks 924, 925 and respective output impedance matching networks 926, 927. The amplification paths 920, 921 may further comprise additional interstage matching elements (not shown) depending on the implementation.

In the embodiment illustrated in FIG. 9, the first bypass path 930 in the first amplifier section 900 comprises a first impedance inverter 932 and a second impedance inverter 934. The first bypass path 930 further comprises one or more nodes (or junctions) coupled to a circuit path that can be selectively coupled to a ground path (or other path of lower impedance) or that has a variable impedance. For example, in the illustrated embodiment, a node 936 is located between the impedance inverters 932, 934 and is selectively coupled to a ground path 940 by a switch 942 as in the embodiments discussed above with respect to FIG. 1. Similarly, the second bypass path 931 of the second amplifier section 901 comprises a third impedance inverter 933 and a fourth impedance inverter 935. The second bypass path 931 further comprises one or more nodes (or junctions) coupled to a circuit path that can be selectively coupled to a ground path (or other path of lower impedance) or that has a variable impedance. For example, in the illustrated embodiment, a node 937 is located between the impedance inverters 933, 935 and is selectively coupled to a ground path 941 by a switch 943 as in the embodiments discussed above with respect to FIG. 1. For instance, the switches 942, 943 can be or effectively be a single-pole single-throw switch (for example, a PIN diode), an attenuator, or other switching or attenuating device.

In the illustrated embodiment, voltage control systems 950, 951 operate the amplifier sections 900, 901 in multiple power modes in response to one-bit control signals $V_{BIAS1}$ and $V_{BIAS2}$. For instance, in one exemplary embodiment, the amplifier sections 900, 901 can be operated in a high-power mode, an intermediate-power mode, and a low-power mode. In this embodiment, one of the amplifier subsections 922, 923 may produce a larger power output than the other. In the high-power mode, for instance, both the amplifier subsections 922, 923 can be activated and the switches 942, 943 closed (for example, $V_{BIAS1}$ and $V_{BIAS2}$ can both be high). In the intermediate-power mode, one of the amplifier subsections 922, 923 can be activated and the corresponding switch 942, 943 closed, while the respective other amplifier subsection is deactivated and its corresponding switch opened (for example, $V_{BIAS1}$ can be high while $V_{BIAS2}$ can be low, or vice versa). In the low-power mode, both of the amplifier subsections 922, 923 can be deactivated and the switch opened (for example, $V_{BIAS1}$ and $V_{BIAS2}$ can both be low).

Figure 6:
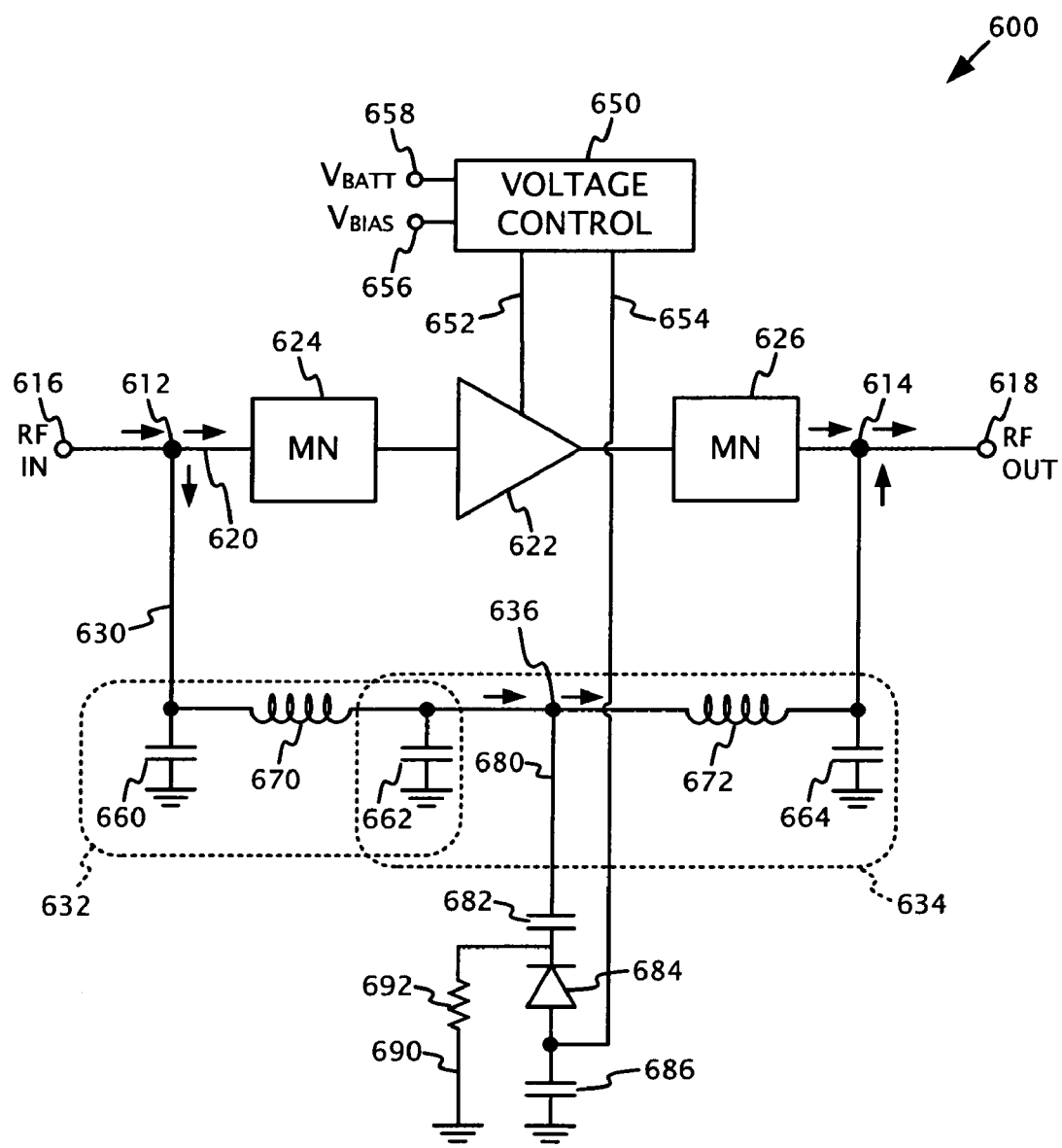
FIG. 6 is a more specific schematic block diagram of a first exemplary implementation of the amplifier section illustrated in FIG. 1.

FIG. 6 is a schematic block diagram showing a more specific implementation of the exemplary amplifier discussed above with respect to FIG. 1. The particular features and elements shown in FIG. 6 and discussed below are not limited to embodiments similar to FIG. 1, but can be implemented in any of the amplifier section embodiments disclosed herein. In FIG. 6, an amplifier section 600 comprises an amplification path 620 coupled between a first node 612 and a second node 614, and a bypass path 630 also coupled between the first node 612 and the second node 614. In the illustrated embodiment, the first node 612 is coupled to an input node 616 configured to receive an input signal (for example, an RF signal), and the second node 614 is coupled to an output node 618 configured to drive a downstream load (for example, an RF antenna section).

The illustrated amplification path 620 comprises an amplifier subsection 622 that includes one or more amplifiers (such as multiple parallel-coupled HBTs). The amplification path 620 further comprises an input impedance matching network 624 at an input of the amplifier subsection 622 and an output impedance matching network 626 at an output of the amplifier subsection 622.

The illustrated bypass path 630 comprises a first impedance inverter 632 and a second impedance inverter 634 implemented using inductive and capacitive elements. For example, in the illustrated embodiment, the first and second impedance inverters 632, 634 are implemented as shunt-C, series-L, shunt-C networks. Specifically, the first impedance inverter 632 is formed from a grounded capacitance element 660, a series inductance element 670, and a grounded capacitance element 662 that is shared with the second impedance inverter 634. A second impedance inverter 634 is formed from a grounded capacitance element 664, a series inductance element 672, and the shared grounded capacitance element 662. The bypass path 630 further comprises a node 636 coupled to a switched ground path 680. For purposes of this disclosure, the node 636 is still referred to as being "between" the first impedance inverter 632 and the second impedance inverter 634, even though it is physically implemented within one of the impedance inverters (in FIG. 6, between the shared grounded capacitance element 662 and the series inductance element 672 of the second impedance inverter 634). In the illustrated arrangement (and in other such arrangements), the node 636 behaves electrically as if it were between the first impedance inverter 632 and the second impedance inverter 634, and is therefore referred to as being "between" the respective impedance inverters. The impedance inverters are not limited to the illustrated implementation, as they may comprise separate capacitance elements or other arrangements.

In the illustrated embodiment, the ground path 680 is coupled to a first capacitance element 682, a diode 684, and a second capacitance element 686. In one particular implementation, the diode 684 comprises a PIN diode (implemented, for instance, as a surface mounted device), which can be forward biased by a voltage applied by an amplifier section control system. For example, in the illustrated embodiment, a voltage control system 650 operates the amplifier section 600 in multiple power modes. For instance, in one exemplary embodiment, the amplifier section 600 is operable in a high-power mode and a low-power mode in response to a control signal ($V_{BIAS}$) applied to a control node 656. In the high-power mode, the amplifier subsection 622 is activated and the diode 684 forward biased, thereby decreasing the diode's impedance. Consequently, the node 636 sees a low impedance on the ground path 680, which is transformed into high impedances at respective opposite ends of the impedance inverters 632, 634. In this mode, an input signal can be transmitted through the amplification path 620 with low signal loss into the bypass path 630. By contrast, in the low-power mode, the amplifier subsection 622 is deactivated and the diode 684 unbiased. The unbiased diode 684 has a high impedance and appears, for example, substantially as an open circuit. Consequently, in the low-power mode, an input signal can be transmitted through the bypass path 630 with little insertion loss into the amplification path 620. Additionally in the low-power mode, little or no current is used because the diode 684 is unbiased. Further, when the diode 684 is unbiased, it appears primarily capacitive. The capacitive effect of the diode 684 can be accounted for in the design of the impedance inverters 630, 632. For example, the shared capacitive element 662 can be designed to account for the capacitive effect of the diode 684 in the low-power mode, thereby reducing any unnecessary signal losses in the bypass path 630.

In the illustrated embodiment, the ground path 680 further comprises a current-limiting resistor 692 on a parallel ground path 690. The current-limiting resistor 692 can be used, for example, to reduce or prevent noise from the bias current for the diode 684 being returned to ground elsewhere in the amplifier section 600. For example, in one particular embodiment, the diode is activated by a current of about 5 mA with a 3.5 V supply, and a current-limiting resistor 692 with a resistance of approximately 700 Ohms is used. The presence of the current-limiting resistor 692 ordinarily causes negligible loss in the low-power mode and substantially no loss in the high-power mode when it is effectively shorted out by activation of the diode 684. The voltage control system 650 can be further configured to apply a supply voltage to the transistors of the amplifier subsection 622 (for example, $V_{BATT}$ applied at a supply node 658).

Figure 7:
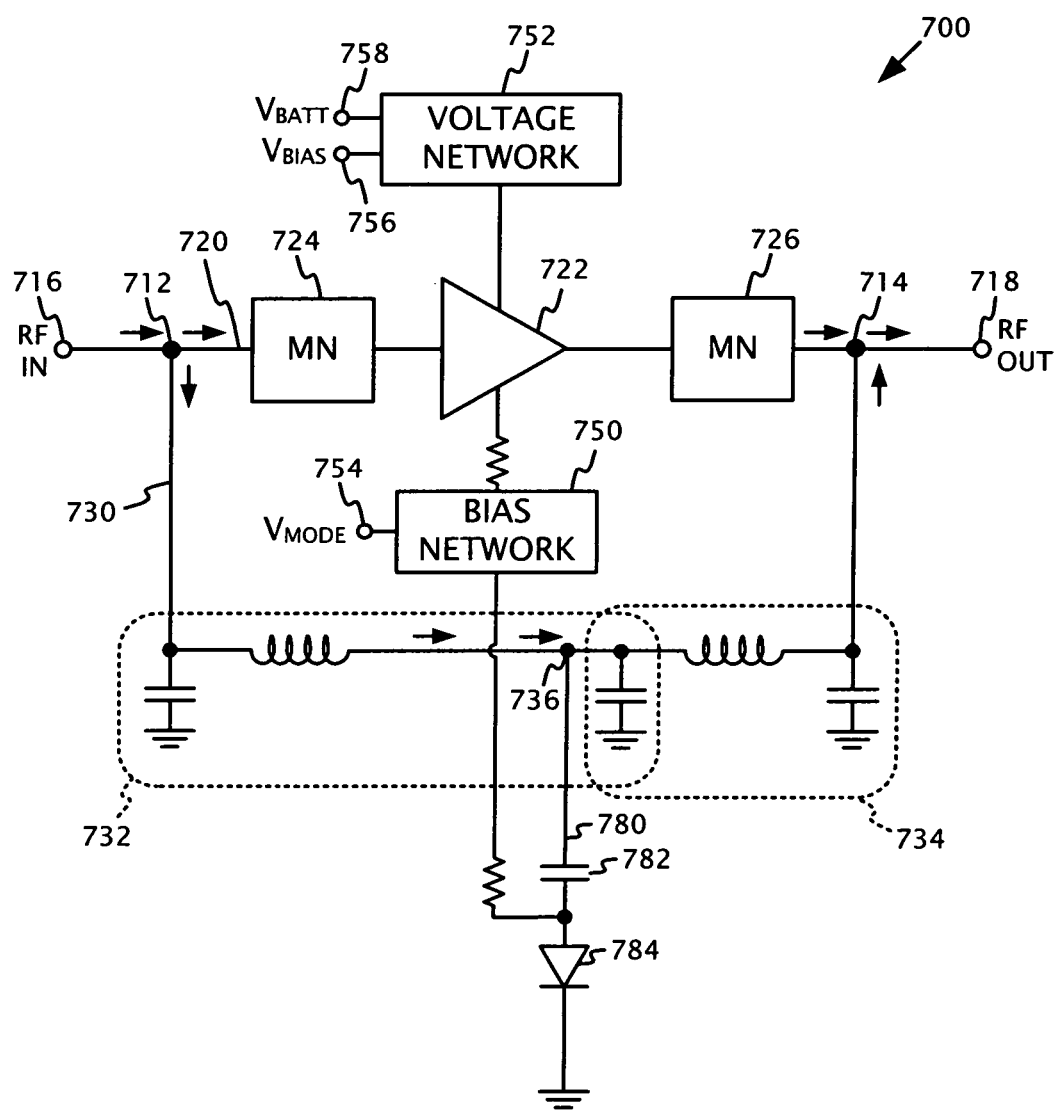
FIG. 7 is a more specific schematic block diagram of a second exemplary implementation of the amplifier section illustrated in FIG. 1.

FIG. 7 is a schematic block diagram showing another implementation of the exemplary amplifier section discussed above with respect to FIG. 1. The particular features and elements shown in FIG. 7 and discussed below are not limited to embodiments similar to FIG. 1, but can be implemented in any of the amplifier section embodiments disclosed herein. In FIG. 7, amplifier section 700 comprises an amplification path 720 coupled between a first node 712 and a second node 714, and a bypass path 730 also coupled between the first node 712 and the second node 714. In the illustrated embodiment, the first node 712 is coupled to an input node 716 configured to receive an input signal (for example, an RF signal output from an earlier amplifier stage), and the second node 714 is coupled to an output node 718 configured to drive a downstream load (for example, an RF antenna section).

The amplification path 720 comprises an amplifier subsection 722 that includes one or more amplifiers (such as multiple parallel-coupled HBTs). The amplification path 720 further comprises an input impedance matching network 724 at an input of the amplifier subsection 722 and an output impedance matching network 726 at an output of the amplifier subsection 722. The bypass path 730 comprises a first impedance inverter 732 and a second impedance inverter 734 implemented using inductive and capacitive elements. For example, in the illustrated embodiment, the first and second impedance inverters 732, 734 are implemented as shunt-C, series-L, shunt-C networks with a shared capacitance element.

The bypass path 730 further comprises a node 736 between the first impedance inverter 732 and the second impedance inverter 734. The node 736 is coupled to a switched ground path 780. In the illustrated embodiment, the ground path 780 comprises a first capacitance element 782 and a diode 784. In one particular implementation, the diode 784 is a PIN diode, which can be forward biased by a voltage applied by a bias network. For example, in the illustrated embodiment, a bias network 750 operates the amplifier section 700 in multiple power modes in response to a one-bit control signal at control node 754. In FIG. 7, for example, the one-bit control signal is the signal $V_{MODE}$.

Because the voltage level of the $V_{MODE}$ signal may not correspond to the desired voltage levels applied to the diode 784 or amplifier subsection 722, the bias network 750 can be configured to provide the appropriate bias voltages (for example, $V_{BIAS}$ supplied at bias node 756). For instance, in one exemplary embodiment, the $V_{MODE}$ signal is low when the high-power mode is desired and high when the low-power mode is desired. Thus, when the $V_{MODE}$ signal is low (corresponding to the high-power mode), the bias network 750 can be configured to forward bias the diode 784 and activate the amplifier subsection 722 (for example, by biasing the bases of respective HBTs in the amplifier subsection 722). Thus, the node 736 sees a low impedance on the ground path 780, which is transformed into high impedances at respective opposite ends of the impedance inverters 732, 734. Further, when the $V_{MODE}$ signal is high (corresponding to the low-power mode), the bias network 750 can be configured to not apply a bias voltage to the diode 784 and to deactivate the amplifier subsection 722 (for example, by unbiasing the bases of respective HBTs in the amplifier subsection). Consequently, the node 736 sees a high impedance on the ground path 780. In other embodiments, the bias network is configured to produce opposite voltage states in response to the $V_{MODE}$ signal. In the illustrated embodiment, voltage supply network 752 is further configured to provide a supply voltage to the one or more amplifiers in the amplifier subsection 722 (for example, $V_{BATT}$ from supply node 758).

Figure 8:
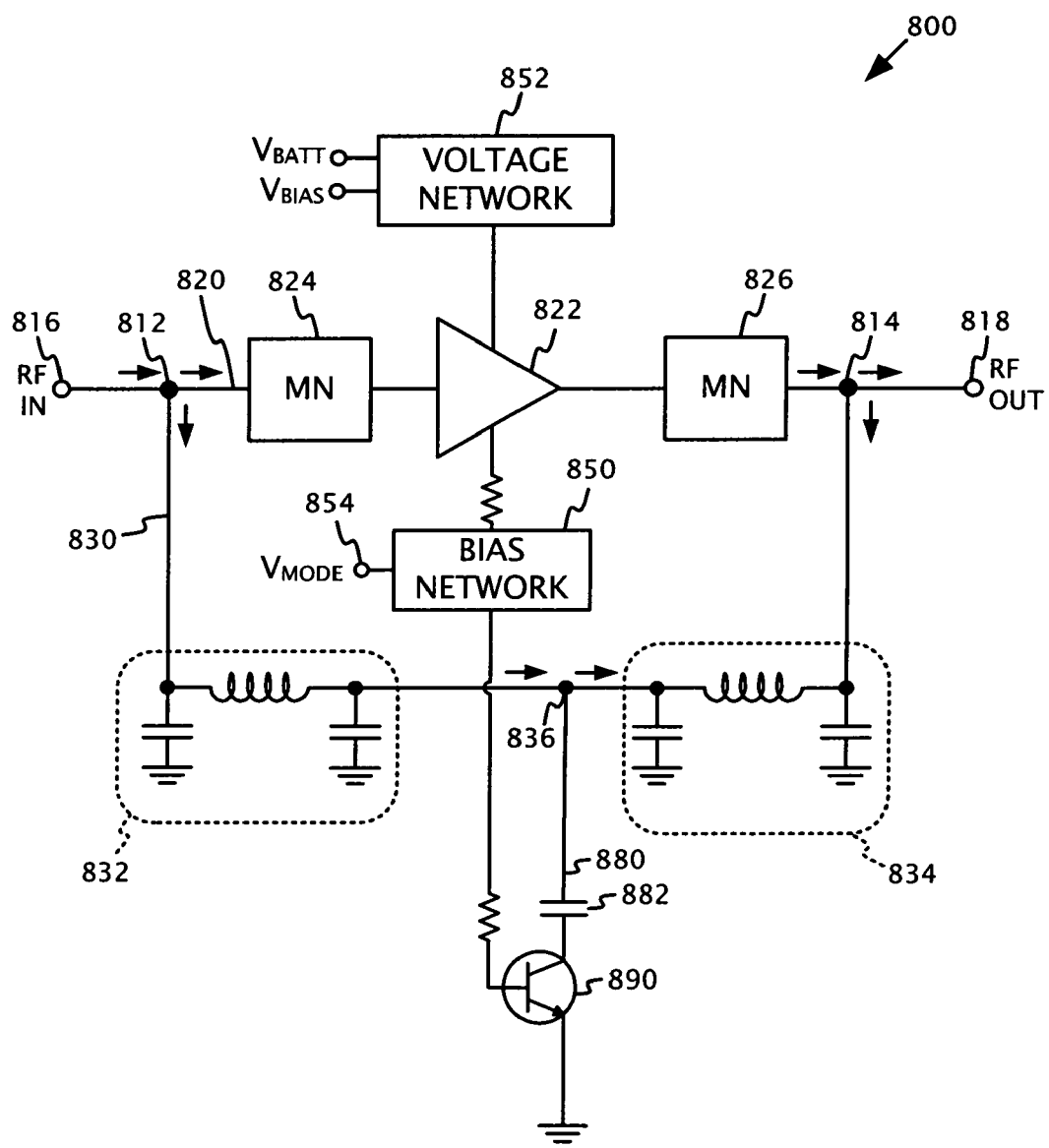
FIG. 8 is a more specific schematic block diagram of a third exemplary implementation of the amplifier section illustrated in FIG. 1.

FIG. 8 is a schematic block diagram showing another specific implementation of the exemplary amplifier section discussed above with respect to FIG. 1. The particular features and elements shown in FIG. 8 and discussed below are not limited to embodiments similar to FIG. 1, but can be implemented in any of the amplifier section embodiments disclosed herein. In FIG. 8, amplifier section 800 comprises an amplification path 820 coupled between a first node 812 and a second node 814, and a bypass path 830 also coupled between the first node 812 and the second node 814. In the illustrated embodiment, the first node 812 is coupled to an input node 816 configured to receive an input signal (for example, an RF signal), and the second node 814 is coupled to an output node 818 configured to drive a downstream load (for example, an RF antenna section).

The amplification path 820 comprises an amplifier subsection 822 that includes one or more amplifiers (such as multiple parallel-coupled HBTs). The amplification path 820 further comprises an input impedance matching network 824 at an input of the amplifier subsection 822 and an output impedance matching network 826 at an output of the amplifier subsection 822. The bypass path 830 comprises a first impedance inverter 832 and a second impedance inverter 834 implemented using inductive and capacitive elements. For example, in the illustrated embodiment, the first and second impedance inverters 832, 834 are implemented as shunt-C, series-L, shunt-C networks.

The bypass path 830 further comprises a node 836 between the first impedance inverter 832 and the second impedance inverter 834. The node 836 is coupled to a path 880 of variable impedance. In the illustrated embodiment, the path 880 comprises a first capacitance element 882 and a transistor 890. In one particular implementation, the transistor 890 is an HBT and, in some embodiments, is implemented on the same chip as the amplifier subsection 822. The control region of the transistor (for example, the base of a BJT-type transistor or the gate of a FET-type transistor) can be selectively biased so that the transistor 890 exhibits a high impedance (effectively making the path 880 appear as an open circuit at the node 836) or a low impedance (effectively shorting the bypass path 830 at the node 836). Thus, the amplifier section 800 can be operated in multiple power modes, such as a high and low power mode. For example, and as more fully explained above with respect to FIG. 7, during a high-power mode the bias network 850 can apply a base-emitter voltage to the transistor 890 such that the transistor 890 has a low impedance and can activate the amplifier subsection 822 (for example, by biasing the bases of respective HBTs in the amplifier subsection). Similarly, during a low-power mode, the bias network 850 can apply a base-emitter voltage to the transistor 890 such that the transistor 890 has a high impedance and can deactivate the amplifier subsection 822 (for example, by unbiasing the bases of respective HBTs in the amplifier subsection).

Having illustrated and described the principles of the illustrated embodiments, it will be apparent to those skilled in the art that the embodiments can be modified in arrangement and detail without departing from such principles. For example, although several of the disclosed embodiment utilize bias toggling to control respective amplifier subsections, other means of selectively enabling and disabling the amplifier subsections can be used. For instance, in embodiments using bipolar junction transistors (BJTs) in the amplifier subsections, the collector-to-emitter voltages of the BJTs can be selectively controlled in order to enable the respective amplifier subsections during high-power operation and to disable (or reduce the gain of) the respective amplifier subsections during low-power operation. Equivalently, in embodiments using field-effect transistors, the drain-to-source voltages can be selectively controlled. Further, the number and location of the impedance matching networks as shown and described herein should not be construed as limiting, as this may vary from implementation to implementation. Likewise, the particular configurations of the control signals described herein should not be construed as limiting. Instead, the control signals can be configured to operate the amplifiers subsections in various other combinations and subcombinations with one another. For example, the amplifier subsections and switches or variable attenuators may be independently controllable.

Further, although many of the disclosed embodiments are shown and described as operating as linear amplifiers, the described amplifier embodiments can be operated as other types of amplifiers, such as saturated amplifiers. For example, any of the disclosed architectures could be used to improve the efficiency of a GSM power amplifier under backed-off power conditions. For instance, according to one exemplary embodiment comprising a power amplifier with a final amplifier stage, if the final stage adds x dB of gain, then at power levels at approximately x dB below maximum power, the final stage is switched off and bypassed using a bypass architecture as disclosed herein. Further, because GSM power amplifier modules usually incorporate a controller (for example, a CMOS controller), multi-mode operation can be realized without an external mode pin. Instead, the logic for determining when power modes should be switched can be incorporated into the controller. Such embodiments can be implemented with little additional cost, as only a small area on the die would be required to implement the logic.

FIGS. 10-13 illustrate an example of a GSM power amplifier operating in multiple power modes using embodiments of the disclosed technology. Assume for purposes of this example that the amplifier section exemplified comprises a controller (such as a CMOS controller) configured to modulate the supply voltage applied to a driver stage amplifier subsection and a final stage amplifier subsection (for example, a supply voltage applied to collectors of one or more HBTs in the respective amplifier subsections) in response to a control voltage ($V_{ctrl}$). The control voltage ($V_{ctrl}$) can be a signal supplied, for example, from a baseband processor of a GSM handset.

Figure 10:
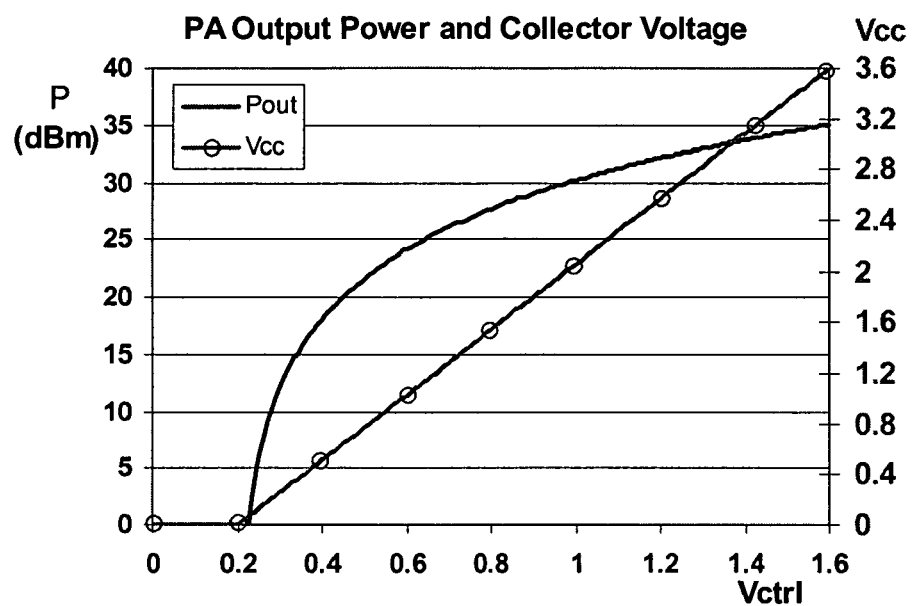
FIG. 10 is a graph showing exemplary output power and collector voltage curves for a representative nonlinear power amplifier.

FIG. 10 is a graph showing the basic operation of the exemplary amplifier section operating in a single power mode. In particular, FIG. 10 shows the output power in dBm (decibels referenced to 1 mW), of the amplifier section when both the driver stage and final stage amplifier subsections are activated ($P_{out}$) and the supply voltage in volts ($V_{cc}$) applied to the respective amplifier sections by the controller as functions of the control voltage ($V_{ctrl}$). As can be seen in FIG. 10, when $V_{ctrl}$ has a value of 1.6 V, the full supply voltage of 3.6 V (for example, from a handset battery that provides a constant voltage of 3.7 V) is applied to the driver stage and final stage amplifier subsections. By contrast, when the control voltage is reduced to 0.8 V, the controller operates to apply about half the full supply voltage, or about 1.8 V, to the amplifier subsections. To regulate the voltage supplied by the battery, the controller typically reduces the excess voltage by dissipating it resistively. Further, because wireless handsets do not usually operate at full power, single power mode saturated power amplifiers in such handsets tend to be very inefficient. Accordingly, to increase efficiency, it is desirable to use one of the bypass architectures described above so that one or more amplifier stages (for example, the final stage) can be disabled when high output power is not needed.

Figure 11:
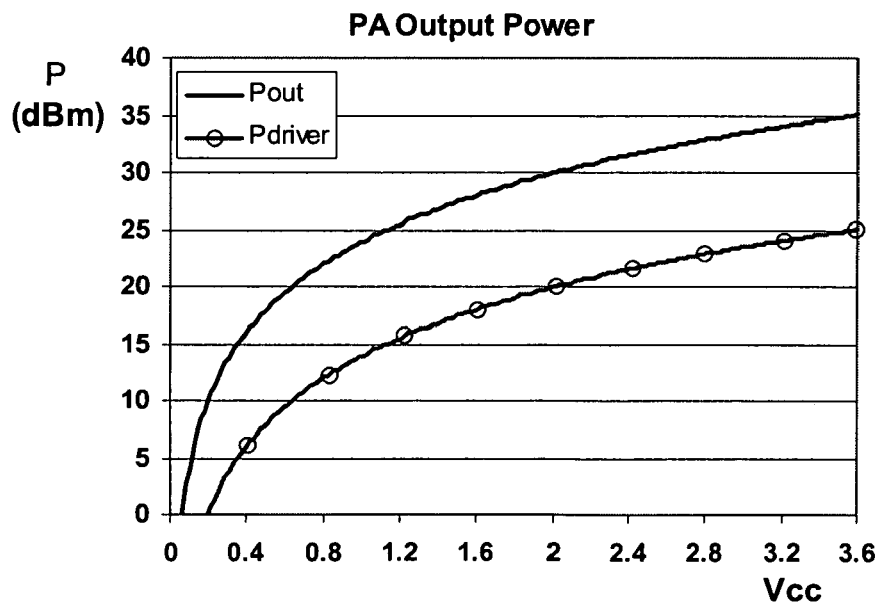
FIG. 11 is a graph showing exemplary output power curves for different power stages of the representative nonlinear power amplifier of FIG. 10.

FIG. 11 is a graph illustrating exemplary output powers provided by two amplifier stages as a function of the control voltage ($V_{cc}$). In particular, FIG. 11 shows the output power from the driver stage amplifier subsection ($P_{driver}$) and the output power from the final stage amplifier subsection in combination with the driver stage amplifier subsection ($P_{out}$). In this example, and as seen in FIG. 11, the output power from the final stage together with the driver stage is about 10 dBm greater than the output power from the driver stage.

Figure 12:
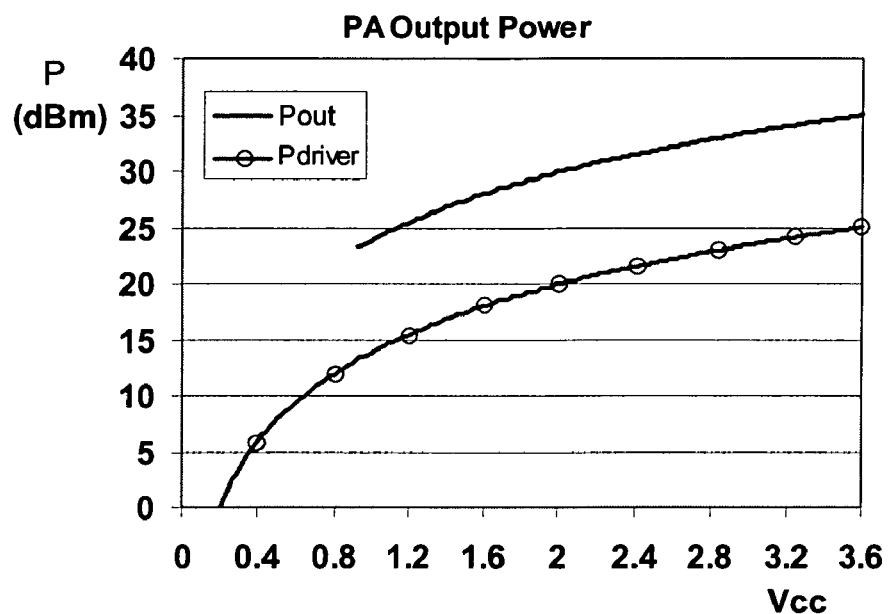
FIG. 12 is a graph showing the exemplary output power curves of FIG. 10 when the representative nonlinear power amplifier operates in multiple power modes.

FIG. 12 is similar to FIG. 11 but shows an example of how the driver stage and final stage amplifier subsections can be operated in multiple power modes in order to achieve higher efficiency. The illustrated multiple mode operation can be implemented, for example, using embodiments of the disclosed bypass path architectures. In particular, in the example shown in FIG. 12, the final stage is bypassed until the desired output power (as determined at least in part, for example, from the voltage control signal ($V_{ctrl}$)) reaches a predetermined level. At or above this level, the final stage can be selectively enabled and the bypass path disabled (for example, by closing a switch or selectively adjusting the impedance of a ground path coupled between two impedance inverting networks as in any of the embodiments described above). For instance, in the example illustrated in FIG. 12, this power mode transition occurs when an output power of about 23 dBm or higher is desired. In some embodiments, by operating the amplifier section in this manner, the controller does not need to resistively dissipate as much power during normal operation, and the overall efficiency of the amplifier section is correspondingly increased.

In certain embodiments, the controller of the amplifier section (typically a CMOS controller) is configured to perform the desired multiple-mode operation. For example, the controller can have logic designed to apply the appropriate voltage to the switching or attenuation element(s) on the bypass path and to apply to the appropriate supply voltages to the amplifiers in the driver and final stages of the amplifier section in order to effectuate the desired multi-mode operation. In some embodiments, the components used to perform multi-mode operation are all implemented within a single power amplifier module. Thus, for example, other components that are typically used with the amplifier module (for example, the baseband processor in a wireless handset) need not be modified.

Figure 13:
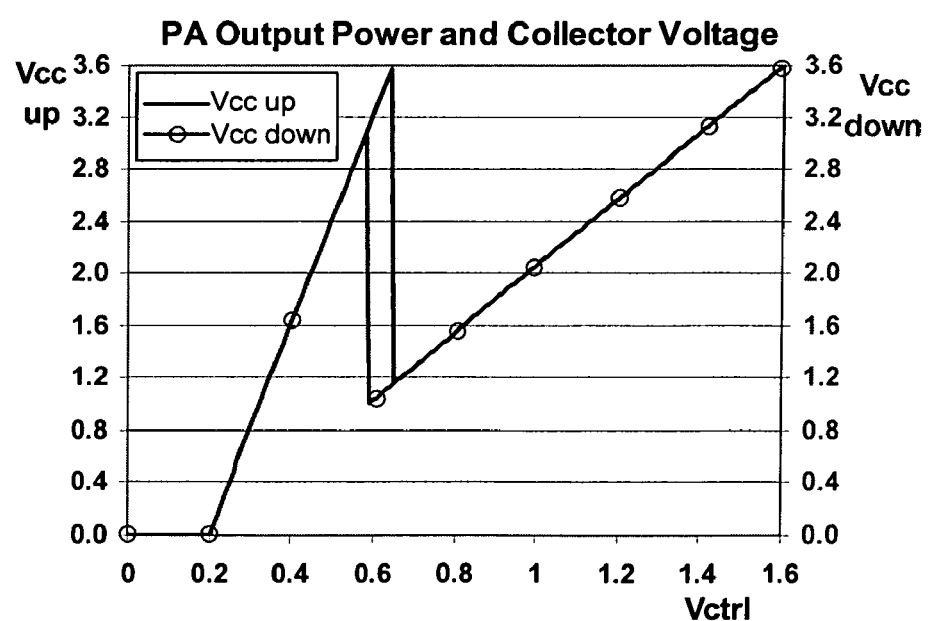
FIG. 13 is a graph showing exemplary supply voltage curves applied by a controller configured to operate the representative nonlinear power amplifier in multiple power modes as in FIG. 12.

FIG. 13 is a graph showing exemplary supply voltages that can be applied to the exemplary amplifier section in order to realize the desired multi-mode operation shown in FIG. 12. In FIG. 13, two sets of supply voltage curves (one for when power demand is increasing ($V_{cc\ up}$) and one for when power demand is decreasing ($V_{cc\ down}$)) are shown. The two exemplary supply voltage curves vary slightly at the power mode transition point (when the bypass path is selectively disabled and the final stage amplifier subsection is activated) to account for hysteresis effects that may be experienced by the amplifier section in actual operation.

Figure 14:
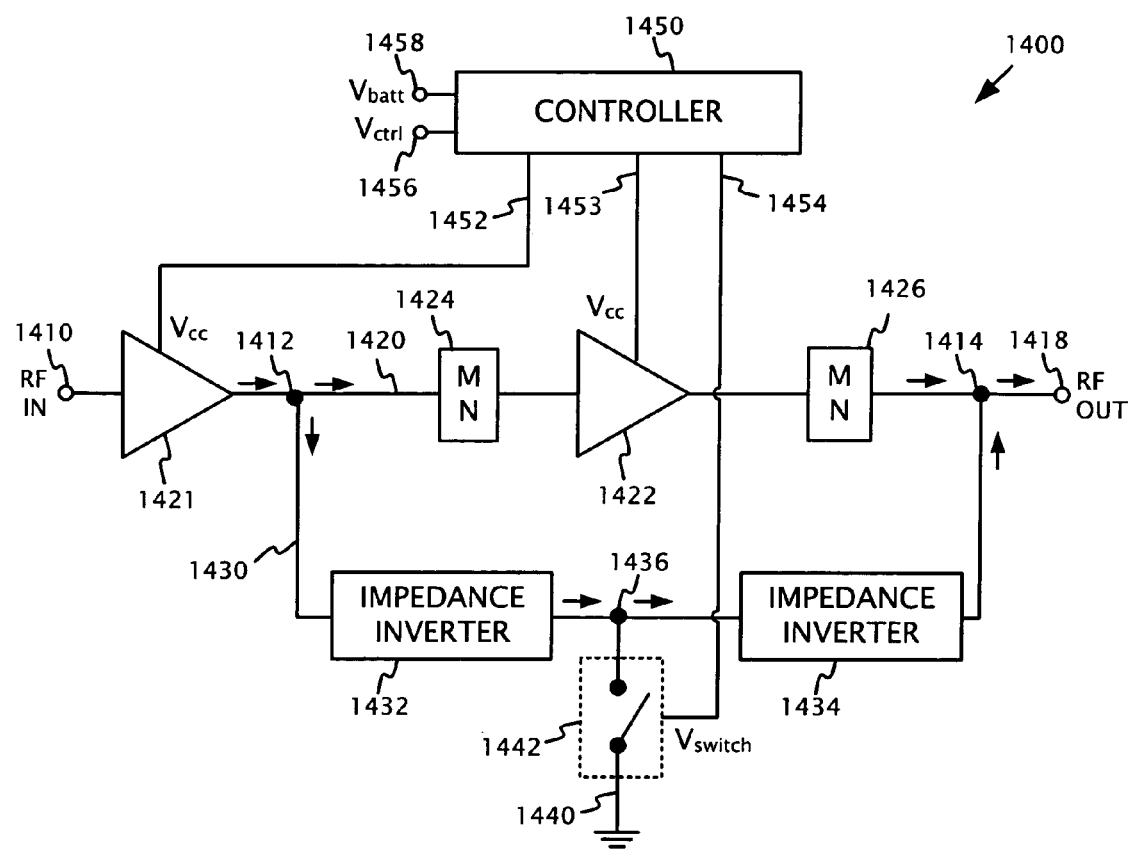
FIG. 14 is a schematic block diagram of an amplifier section in accordance with a seventh exemplary embodiment of the disclosed technology.

FIG. 14 is a schematic block diagram of an exemplary multi-mode amplifier section having two amplifier stages operable in accordance with the principles exemplified in FIGS. 12 and 13. More specifically, amplifier section 1400 comprises a driver stage amplifier subsection 1421 having an input coupled to an input node 1410 (configured, for example, to receive an RF signal) and an output coupled to a bypassable final stage amplifier subsection 1422. In the illustrated example, the driver stage amplifier subsection 1421 and the final stage amplifier subsection 1422 each comprise one or more amplifiers operable in a saturation mode (for example, multiple parallel-connected transistors, such as HBTs). Further, the final stage amplifier subsection 1422 is located on an amplification path 1420 coupled between a first node 1412 and a second node 1414. The amplification path 1420 further includes an input impedance matching network 1424 and an output impedance matching network 1426. Depending on the implementation, additional matching networks (not shown) may be located at the input and output of the driver stage amplifier subsection 1421 or before the output node 1418. A bypass path 1430 is also coupled between the first node 1412 and the second node 1414.

In the embodiment illustrated in FIG. 14, the bypass path 1430 comprises a first impedance inverter 1432 and a second impedance inverter 1434. The bypass path 1430 further comprises one or more nodes (or junctions) coupled to a circuit path that can be selectively coupled to a ground path (or other path of lower impedance) or that has a variable impedance. For example, in the illustrated embodiment, a node 1436 is located between the impedance inverters 1432, 1434 and is selectively coupled to a ground path 1440 by a switch 1442 as in the embodiments discussed above with respect to FIG. 1. For instance, the switch 1442 can be or effectively be a single-pole single-throw switch (for example, a PIN diode), an attenuator, or other switching or attenuating device.

In the illustrated embodiment, a controller 1450 (such as a CMOS controller, which may be implemented on the same substrate as the amplifier section 1400) operates the amplifier section 1450 in multiple power modes. The illustrated controller 1450 is coupled to the driver stage amplifier subsection 1421 via control line 1452, to the final stage amplifier subsection 1422 via control line 1453, and to the switch 1442 via control line 1454. As explained above with respect to FIGS. 10-13, the controller 1450 can be configured to apply a variable supply voltage ($V_{cc}$) in response to a control voltage ($V_{ctrl}$) applied, for example, at a control node 1456 of the controller 1450 (for instance, from a baseband processor of a GSM handset). The supply voltage ($V_{cc}$) can be derived from a constant battery voltage ($V_{batt}$) applied at a supply node 1458 of the controller 1450. In one embodiment, the controller 1450 resistively dissipates excess voltage from $V_{batt}$ not applied to the amplifier subsections. The controller 1450 in FIG. 14 is further configured to apply a variable or fixed switching voltage ($V_{switch}$) to the switch 1442 in response to internal logic in order to effectuate the desired multi-mode operation. For instance, in the illustrated embodiment, the controller 1450 can be configured to operate the amplifier section 1400 in a high-power mode and a low-power mode in accordance with FIG. 13. Thus, in one particular implementation, when the desired output power from the amplifier section 1400 is from about 25 dBm to 35 dBm (corresponding to $V_{ctrl}$ being approximately 0.6 or higher), the controller 1450 can operate the amplifier section 1400 in a high-power mode by applying the switching voltage ($V_{switch}$) to switch 1442, causing the switch 1442 to close, and applying the appropriate supply voltages to both the driver stage and final stage amplifier subsections 1421, 1422 (in accordance with FIG. 13, for example). By contrast, when the desired output power from the amplifier section 1400 is from about 0 dBm to 25 dBm (corresponding to $V_{ctrl}$ being approximately 0.6 or lower), the controller 1450 can operate the amplifier section 1400 in a low-power mode by not applying the switching voltage ($V_{switch}$) to switch 1442 (causing the switch 1442 to remain open), deactivating the final stage amplifier subsection 1422, and applying the appropriate supply voltages to the driver stage amplifier subsection 1421 (in accordance with FIG. 13, for example). In this way, the amplifier section 1400 can be operated with increased efficiency than single-mode saturated amplifier sections. It should be understood that the amplifier architecture in FIG. 14 is for illustrative purposes only and should not be construed as limiting in any manner. Instead, any of the disclosed bypass architectures may be used in an amplifier section using nonlinear amplifiers and operated as exemplified in FIGS. 10-13.

In view of the many possible embodiments, it will be recognized that the illustrated embodiments include only examples and should not be taken as a limitation on the scope of the invention. Rather, the invention is defined by the following claims. I therefore claim as the invention all such embodiments and their equivalents that come within the scope of these claims.

I claim:

1. An amplifier circuit, comprising:
    an amplifier path coupled between a first node and a second node, the amplifier path comprising one or more amplifiers;
    a bypass path coupled between the first node and the second node, the bypass path comprising two impedance inverting networks and a ground path that is selectively coupled to the bypass path at a third node located between the two impedance inverting networks; and
    a control system configured to control the ground path so that it is effectively coupled to the bypass path in a first amplifier mode and effectively decoupled from the bypass path in a second amplifier mode, wherein the control system is further configured to activate the one or more amplifiers of the amplifier path in the first mode and to deactivate at least one of the amplifiers of the amplifier path in the second mode,
    wherein the third node is configured to remain coupled to the two impedance inverting networks when the ground path is coupled to the bypass path.

2. The amplifier circuit of claim 1, wherein the one or more amplifiers are nonlinear amplifiers.

3. The amplifier circuit of claim 1, wherein the ground path comprises a switching element configured to selectively couple the ground path to the bypass path at the third node.

4. The amplifier circuit of claim 3, wherein the switching element is the only switching element on the bypass path.

5. The amplifier circuit of claim 3, wherein the switching element is a semiconductor device.

6. The amplifier circuit of claim 5, wherein the semiconductor device is a PIN diode.

7. The amplifier circuit of claim 1, wherein substantially no current is used in the bypass path or the amplifier path in the second amplifier mode.

8. An amplifier circuit, comprising:
    an amplifier path coupled between a first node and a second node, the amplifier path comprising one or more amplifiers;
    a bypass path coupled between the first node and the second node, the bypass path comprising two impedance inverting networks and a ground path that is selectively coupled to the bypass path at a third node located between the two impedance inverting networks; and
    a control system configured to control the ground path so that it is effectively coupled to the bypass path in a first amplifier mode and effectively decoupled from the bypass path in a second amplifier mode, wherein the control system is further configured to receive an external control signal indicative of a desired output power and to select one of the first or second amplifier modes based at least in part on the value of the external control signal,
    wherein the third node is configured to remain coupled to the two impedance inverting networks when the ground path is coupled to the bypass path.

9. The amplifier circuit of claim 8, wherein the control system is further configured to select one of the first or second amplifier modes based at least in part on whether the control signal is rising or falling.

10. An electronic device comprising the amplifier circuit of claim 1.

11. The electronic device of claim 10, wherein the electronic device is a mobile phone.

12. An amplifier circuit, comprising:
    a first RF signal path coupled between a first node and a second node, the first RF signal path comprising one or more amplifiers; and
    a second RF signal path coupled between the first node and the second node, the second RF signal path comprising a first impedance inverter, a second impedance inverter, and an intermediate third node coupled to a circuit path having an adjustable impedance, wherein the circuit path comprises a path to ground that is coupled to the third node by a variable attenuator or variable resistor, the impedance at the first node and the impedance at the second node being dependent on the impedance of the circuit path.

13. The amplifier circuit of claim 12, wherein the circuit path comprises a path to ground that is coupled to the third node by a switch.

14. An electronic device comprising the amplifier circuit of claim 12.

15. An amplifier circuit, comprising:
an amplifier bypass path in substantially continuous electrical communication with an input node and an output node, the amplifier bypass path consisting essentially of two or more impedance inverters and a ground path switchably coupled to a junction positioned between two of the impedance inverters, wherein the impedance inverters are implemented as respective LC networks.

16. The amplifier circuit of claim 15, further comprising an amplification path that the amplifier bypass path is configured to bypass, the amplification path comprising one or more amplifiers that are activated when the amplifier bypass path is coupled to the ground path.

17. The amplifier circuit of claim 16, wherein the one or more amplifiers are heterojunction bipolar transistors.

18. The amplifier circuit of claim 16, wherein the one or more amplifiers are operated as saturated power amplifiers.

19. The amplifier circuit of claim 15, wherein the impedance inverters are configured to substantially impedance match the input node and the output node when the amplifier bypass path is decoupled from the ground path.

20. The amplifier circuit of claim 15, wherein the impedance inverters share at least one common capacitance element or inductance element.

21. The amplifier circuit of claim 15 implemented on a single semiconductor substrate.

22. An electronic device comprising the amplifier circuit of claim 15.

23. The electronic device of claim 22, wherein the electronic device is a mobile phone.

24. An amplification method, comprising:
in a first amplifier mode, reducing an impedance at a node in an amplifier bypass path and thereby causing respective impedances at respective ends of the bypass path to increase, and in a second amplifier mode, increasing the impedance at the node and thereby causing the respective impedances at the respective ends of the bypass path to decrease, wherein reducing an impedance at the node and increasing the impedance at the node comprise altering a voltage applied to a control region of a switch.

25. The method of claim 24, further comprising, in the first amplifier mode, altering a voltage applied to one or more transistors in a parallel amplifier path such that the transistors provide substantially linear or nonlinear amplification; and in the second amplifier mode, altering the voltage applied to the transistors in the parallel amplifier path such that the transistors are deactivated.

26. The method of claim 24 performed in response to a control signal.

27. The method of claim 26, wherein the control signal is indicative of a desired output power, and wherein the method further comprises adjusting at least one of a bias voltage or a supply voltage in response to the value of the control signal, the bias voltage and the supply voltage being applied to one or more amplifiers in a parallel amplifier path.

28. An electronic device configured to perform the method of claim 24.

29. The amplifier circuit of claim 8, wherein the one or more amplifiers are nonlinear amplifiers.

30. The amplifier circuit of claim 8, wherein the ground path comprises a switching element configured to selectively couple the ground path to the bypass path at the third node.

31. The amplifier circuit of claim 30, wherein the switching element is the only switching element on the bypass path.

32. The amplifier circuit of claim 30, wherein the switching element is a semiconductor device.

33. The amplifier circuit of claim 8, wherein substantially no current is used in the bypass path or the amplifier path in the second amplifier mode.

* * * * *